(12) United States Patent
Crepaldi et al.

(10) Patent No.: US 10,879,909 B2
(45) Date of Patent: Dec. 29, 2020

(54) PHASE-LOCKED LOOP CIRCUIT FOR HIGH BIT-RATE AND LOW CONSUMPTION TRANSMISSION SYSTEMS

(71) Applicant: FONDAZIONE ISTITUTO ITALIANO DI TECNOLOGIA, Genoa (IT)

(72) Inventors: Marco Crepaldi, Biella (IT); Gian Nicola Angotzi, Genoa (IT); Luca Berdondini, Genoa (IT)

(73) Assignee: FONDAZIONE ISTITUTO ITALIANO DI TECNOLOGIA

( * ) Notice: Subject to any disclaimer, the term of this patent is extended or adjusted under 35 U.S.C. 154(b) by 0 days.

(21) Appl. No.: 16/613,610

(22) PCT Filed: May 25, 2018

(86) PCT No.: PCT/IB2018/053755
§ 371 (c)(1),
(2) Date: Nov. 14, 2019

(87) PCT Pub. No.: WO2018/215991
PCT Pub. Date: Nov. 29, 2018

(65) Prior Publication Data
US 2020/0106449 A1    Apr. 2, 2020

(30) Foreign Application Priority Data
May 25, 2017 (IT) .......................... 102017000057049

(51) Int. Cl.
*H03L 7/087*     (2006.01)
*H03L 7/081*     (2006.01)
*H03L 7/199*     (2006.01)

(52) U.S. Cl.
CPC ............ *H03L 7/0816* (2013.01); *H03L 7/087* (2013.01); *H03L 7/199* (2013.01)

(58) Field of Classification Search
CPC ....... H03L 7/0995; H03L 7/0816; H03L 7/087; H03L 7/199; H03L 7/085; H03L 7/16;
(Continued)

(56) References Cited

U.S. PATENT DOCUMENTS 6,483,361 B1 * 11/2002 Chiu .................... H03L 7/0891
327/157
2015/0355671 A1    12/2015 Coutts et al.

FOREIGN PATENT DOCUMENTS

JP           S60 142623 A       7/1985

OTHER PUBLICATIONS

PCT Written Opinion and International Search Report for PCT Patent Application No. PCT/IB2018/053755 dated Aug. 14, 2018. 10 Pages.

* cited by examiner

*Primary Examiner* — Sibin Chen
(74) *Attorney, Agent, or Firm* — McAndrews, Held & Malloy, Ltd.

(57) ABSTRACT

A Phase-locked loop circuit including: a local oscillator, configured to generate a timing signal; a variable-length shift register, controlled by the timing signal; and a feedback control circuit, which receives a pulsed input signal and receives a local signal from the shift register. The feedback control circuit detects whether each pulse of the input signal respects a condition of temporal proximity with a corresponding pulse of the local signal and detects, for each pulse of the input signal that respects the proximity condition, whether the edge falls early, late, or within a predefined portion of the corresponding pulse of the local signal. The feedback control circuit controls the length of the shift register and the frequency of the timing signal, as a function of the detections made.

18 Claims, 10 Drawing Sheets

(58) Field of Classification Search
CPC .. H03L 7/08; G11C 7/222; G11C 7/22; H04B 1/707; G06K 7/008
See application file for complete search history.

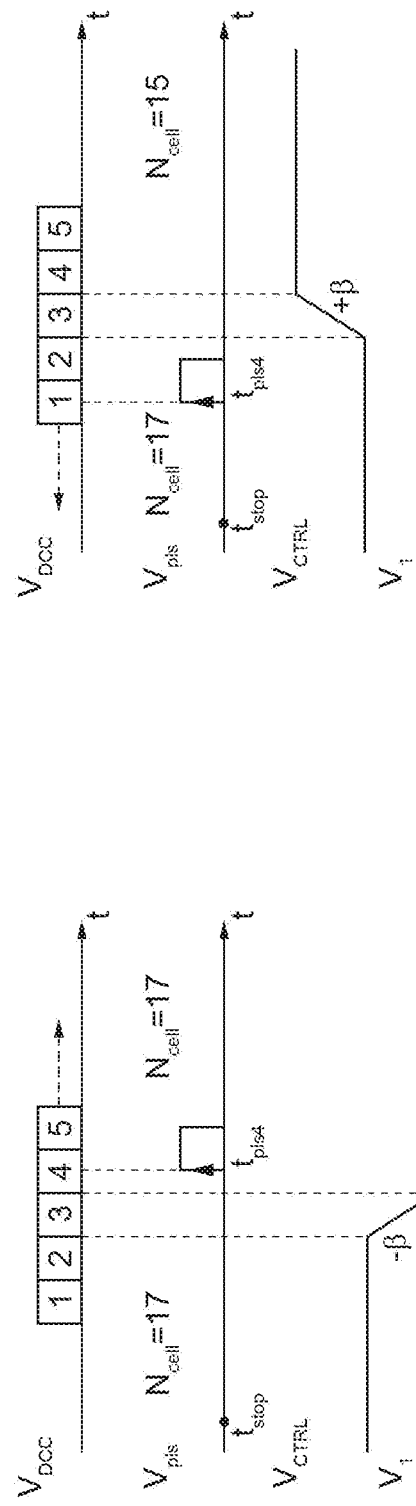
FIG. 4B
FIG. 4C
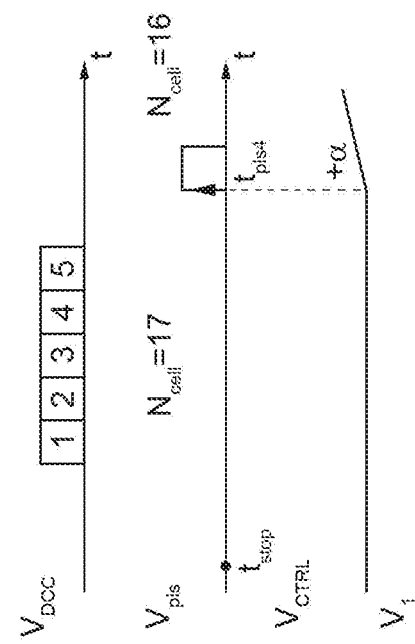
FIG. 4E
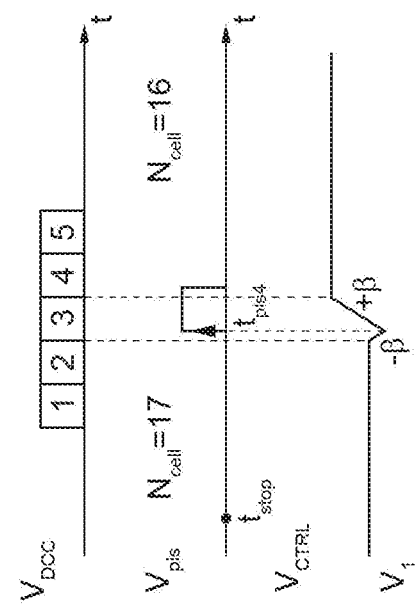
FIG. 4D

PHASE-LOCKED LOOP CIRCUIT FOR HIGH BIT-RATE AND LOW CONSUMPTION TRANSMISSION SYSTEMS

PRIORITY CLAIM

The present application is filed pursuant to 35 U.S.C. 371 as a U.S. National Phase application of International Patent Application No. PCT/IB2018/053755, which was filed May 25, 2018, claiming the benefit of priority to Italian Patent Application No. 102017000057049 filed on May 25, 2017. The entire text of the aforementioned applications is incorporated herein by reference in its entirety.

TECHNICAL FIELD

The present invention refers to a phase-locked loop circuit and, in particular, to a phase-locked loop circuit for high bit-rate and low consumption transmission systems.

BACKGROUND ART

As is known, nowadays the wireless transmission technology known as Impulse-Radio Ultra-Wide Band (IR-UWB) is available, which transmits data by using radio-frequency pulses of extremely short duration (for example, from a few tens of picoseconds to a few nanoseconds). These pulses are represented by a few wave cycles of a radiofrequency carrier and so their spectral occupation is very wide.

IR-UWB technology has found wide usage mainly in short-range and high bit-rate applications, such as telemetry applications in the biomedical field for example.

In greater detail, IR-UWB technology is characterized by generally low energy budgets. For example, there are known IR-UWB architectures in which the energy budget is equal to approximately 10 pJ per pulse. In relation to this, there are known IR-UWB transmitters that include respective phase-locked loops (PLL), the characteristics of which affect the energy budget. These phase-locked loops must therefore be optimized in order to reduce consumption.

More generally, the need to have phase-locked loops characterized by low consumption is encountered in various fields of application, of which IR-UWB technology is just a possible example.

DISCLOSURE OF INVENTION

The object of the present invention is therefore to provide a phase-locked loop that enables meeting, at least in part, the needs previously indicated.

According to the invention, a phase-locked loop circuit is provided as defined in the appended claims.

BRIEF DESCRIPTION OF THE DRAWINGS

For a better understanding of the invention, some embodiments will now be described, purely by way of a non-limitative example and with reference to the accompanying drawings, in which:

FIGS. 4B-4E show, on an enlarged scale, examples of possible developments over time of the signals shown in FIG. 4A.

BEST MODE FOR CARRYING OUT THE INVENTION

Figure 1:
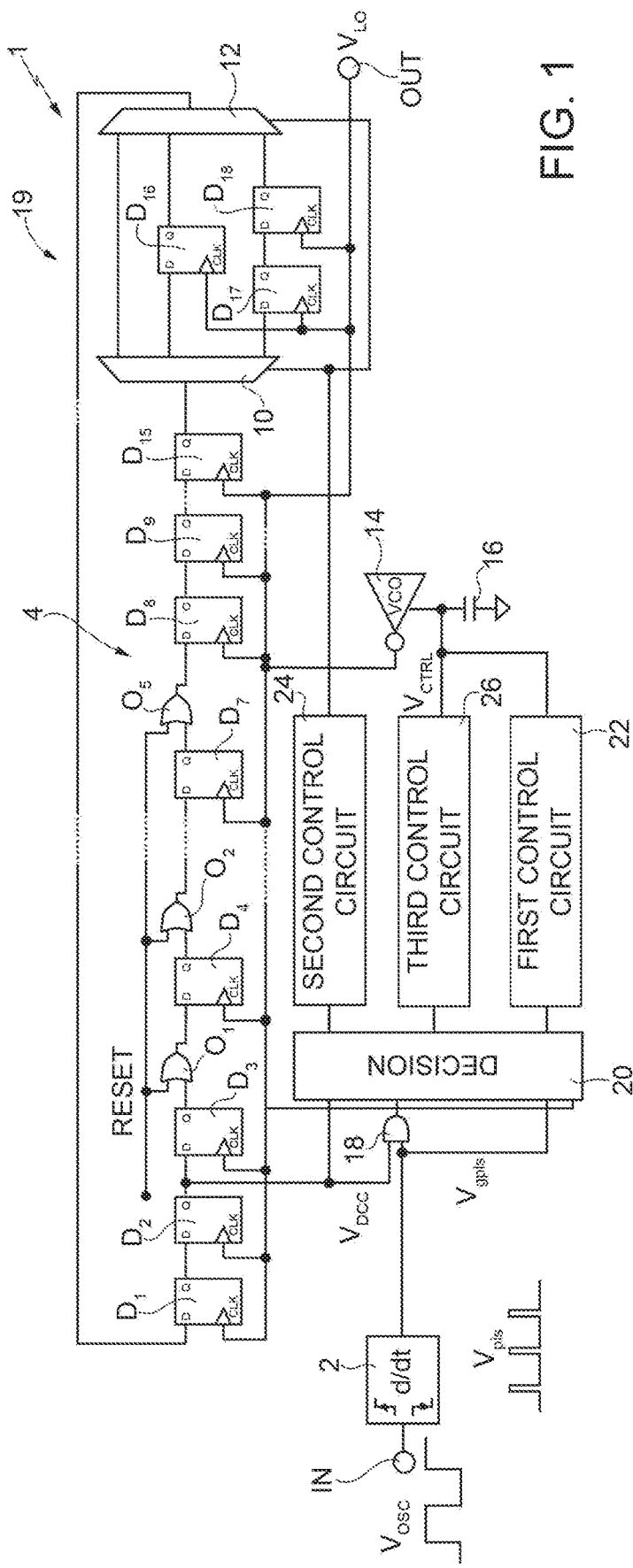
FIG. 1 shows a circuit diagram of a phase-locked loop.

FIG. 1 shows an electronic circuit 1, which shall hereinafter be referred to as the phase-locked loop 1.

The phase-locked loop 1 comprises an input terminal IN and an output terminal OUT; in addition, the phase-locked loop 1 comprises an input stage 2, the input of which is connected to the input terminal IN.

The phase-locked loop 1 also comprises a delay chain 4, which comprises fifteen delay elements respectively indicated by $D_1$-$D_{15}$; with regard to this, FIG. 1 only shows the first, second, third, fourth, seventh, eighth, ninth and fifteenth delay elements, which are indicated by $D_1$, $D_2$, $D_3$, $D_4$, $D_7$, $D_8$, $D_9$ and $D_{15}$, respectively.

In detail, the fifteen delay elements are formed by corresponding cascade-connected, mutually identical flip-flops. In other words, each delay element forms a corresponding digital type of memory cell, which stores a corresponding bit.

In greater detail, the flip-flops that form the delay elements $D_1$-$D_{15}$ are of the latch type, and so each of them has a timing input (indicated by CLK), a data input (indicated by D) and an output (indicated by Q). Furthermore, the output of the i-th flip-flop (where i=1, 2, ..., 14) is connected, directly or indirectly, to the data input of the i+1-th flip-flop, as described below.

The phase-locked loop 1 also comprises a first and a second multiplexer 10 and 12, each of which has a respective control terminal.

The first multiplexer 10 also has an input, which is connected to the output of the flip-flop of the fifteenth delay element $D_{15}$, and three outputs; the second multiplexer 12 has three inputs and an output, which is connected to the data input of the flip-flop that forms the first delay element $D_1$. The phase-locked loop 1 also comprises a sixteenth, a seventeenth and an eighteenth delay element $D_{16}$-$D_{18}$, which are formed by corresponding flip-flops identical to the flip-flops that form the delay elements $D_1$-$D_{15}$.

In detail, the first output of the first multiplexer 10 is connected to the first input of the second multiplexer 12. The second output of the first multiplexer 10 is connected to the data input of the flip-flop that forms the sixteenth delay element $D_{16}$, the output of which is connected to the second input of the second multiplexer 12. The third output of the first multiplexer 10 is connected to the data input of the flip-flop that forms the seventeenth delay element $D_{17}$, the output of which is connected to the data input of the flip-flop that forms the eighteenth delay element $D_{18}$, the output of which is connected to the third input of the second multiplexer 12.

The timing inputs of the eighteen flip-flops that form the eighteen delay elements $D_1$-$D_{18}$ are connected to the output terminal OUT, on which, in use, there is a signal $V_{LO}$, which shall hereinafter be referred to as the locked signal $V_{LO}$.

The phase-locked loop 1 also comprises five logical OR gates, although FIG. 1 only shows the first, second and fifth logical OR gates, which are respectively indicated by $O_1$, $O_2$ and $O_5$. Each of the aforementioned five logical OR gates has a respective first input, which is designed to receive a RESET signal, as well as a respective second input and an output. Without any loss of generality, the second input of the j-th logical gate $O_j$ (where j=1, 2, . . . , 5) is connected to the output of the flip-flop that forms the j+2-th delay element $D_{j+2}$; the output of the j-th logical gate $O_j$ (where j=1, 2, . . . , 5) is connected to the data input of the flip-flop that forms the j+3-th delay element $D_{j+3}$.

The phase-locked loop 1 also comprises an oscillator 14 of the voltage-control type, a capacitor 16, a logical AND gate 18, which shall hereinafter be referred to as the gating logical gate 18, a decision stage 20 and three circuits, which shall hereinafter be referred to respectively as the first, the second and the third control circuit 22, 24 and 26.

In detail, a first input of the gating logical gate 18 is connected to the output of the flip-flop that forms the second delay element $D_2$; the second input of the gating logical gate 18 is connected to the output of the input stage 2. The output of the gating logical gate 18 is connected to a corresponding input of the decision stage 20, which also has three further inputs, which are respectively connected to the output of the flip-flop that forms the second delay element $D_2$, to the output of the input stage 2 and to the output terminal OUT.

The decision stage 20 also has three outputs, which are respectively connected to the first, second and third control circuits 22, 24 and 26. In particular, each of the first, second and third control circuits 22, 24 and 26 has a respective first input, which is connected to a corresponding output of the decision stage 20; in addition, each of the first, second and third control circuits 22, 24 and 26 has a respective output.

The outputs of the first and third control circuits 22 and 26 are connected to a first terminal of the capacitor 16, the second terminal of which is connected to earth.

The output of the second control circuit 24 is connected to the control terminals of the first and second multiplexers 10 and 12.

In practice, the eighteen flip-flops that form the delay elements $D_1$-$D_{18}$ and the first and second multiplexers 10 and 12 form a circular shift register 19, i.e. a delay loop of variable length, this length being electronically controlled by the second control circuit 24. In particular, the shift register 19 can be alternatively formed by fifteen, sixteen or seventeen flip-flops. In consequence, the overall delay introduced by the shift register 19 is variable; with regard to this, each flip-flop introduces a delay equal to an impulse of the signal on its timing input, this signal being precisely equal to the locked signal $V_{LO}$.

Although only shown in FIG. 2, each of the first, second and third control circuits 22, 24 and 26 also receives as input a recirculating signal $V_{DCC}$ and a signal $V_{pls}$, described below.

Referring again to FIG. 1, the first terminal of the capacitor 16 is also connected to the input of the oscillator 14, the output of which is connected to the output terminal OUT. The oscillator 14 thus generates the locked signal $V_{LO}$, which, as described in detail below, is formed by a square wave with a 50% duty cycle and has a frequency that depends in a substantially linear manner on the voltage at the capacitor 16. Hereinafter, the voltage at the capacitor 16 shall be referred to as voltage $V_{CTRL}$.

Figure 3:
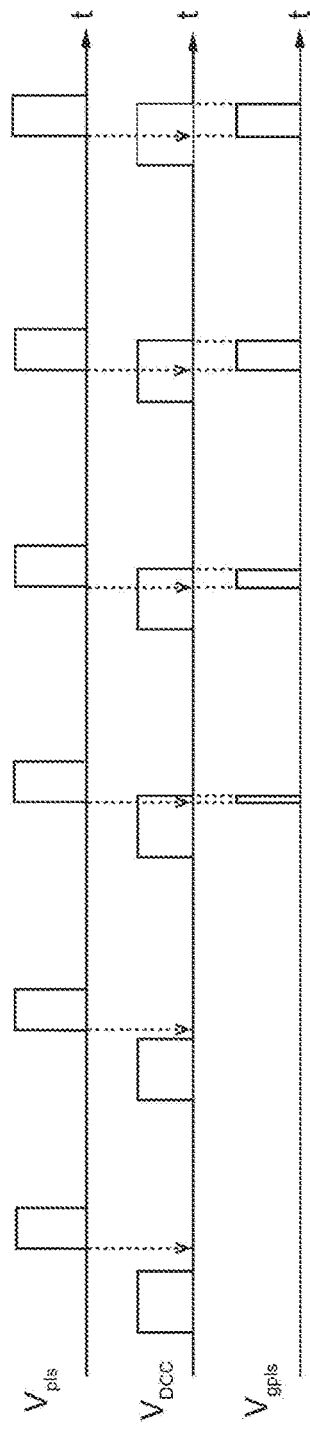
FIG. 3 qualitatively shows the temporal plots of signals generated in the phase-locked loop shown in FIG. 1.

In use, the phase-locked loop 1 is configured to receive, on the input terminal IN, a periodic input signal $V_{OSC}$, which is formed, for example, by a square wave with a 50% duty cycle and has a frequency $f_{REF}$ equal, for example, to 31.25 MHz. Furthermore, the input stage 2 generates the aforesaid $V_{pls}$ signal, which has a duty cycle of less than 50%, at its output. In relation to this, the input stage 2 generates a pulse for each leading or trailing edge of the input signal $V_{OSC}$, therefore acting as a kind of shunt. Hereinafter the pulses of the $V_{pls}$ signal are referred to as PLS pulses. Examples of PLS pulses and pulses of the recirculating signal $V_{DCC}$ are shown in FIG. 3; in particular, FIG. 3 shows a train of six PLS pulses and a train of six pulses of the recirculating signal $V_{DCC}$. The temporal distances between the pulses shown in FIG. 3 are purely qualitative and only serve as a representation of examples of reciprocal arrangements between PLS pulses and corresponding pulses of the recirculating signal $V_{DCC}$; for this reason, the evolutions over time of the temporal distances between the pulses shown in FIG. 3 should not be interpreted quantitatively.

That having been said, the phase-locked loop 1 works like a kind of continuous-time state machine, which at each moment of time can be in one of three possible states, described below. Furthermore, the phase-locked loop 1 is based on the recirculation of the aforesaid recirculating signal $V_{DCC}$ in the shift register 19.

In detail, the shift register 19 works like a 16-element circular shift register, where the last element is designed to provide, when required, an advance or delay of one clock impulse, where clock impulse means a period $T_{CLK}$ of the locked signal $V_{LO}$. Furthermore, as previously mentioned, the shift register 19 has a circular form, i.e. its output is connected to its input.

In greater detail, after starting, i.e. the moment in which the RESET signal is set to '1', the flip-flops that respectively form the fourth, fifth, sixth, seventh and eighth delay elements $D_4$-$D_8$ store the logic value '1', while the other flip-flops of the shift register store the logic value '0'; with regard to this, the flip-flops that must store logic value '0' are connected so as to also receive the RESET signal, although this last characteristic is not visible in FIG. 1.

In other words, a subsequence formed by five consecutive '1' values is stored in the shift register 19, and in particular in the delay chain 4; the remaining bits are set to '0', and therefore the aforesaid bit subsequence is preceded by and followed by two bits equal to '0'.

That having been said, considering the output of any one of the fifteen delay elements $D_1$-$D_{10}$ of the delay chain 4, the aforesaid recirculating signal $V_{DCC}$, which originates from the shift inside the shift register 19 of the sequence of bits stored in the shift register 19, said shift being clocked by the locked signal $V_{LO}$, is available on this output.

In greater detail, reference shall be made hereinafter, without any loss of generality, to the recirculating signal $V_{DCC}$ to indicate the signal present at the output of the flip-flop that forms the second delay element $D_2$. In consequence, there is a delayed version of the recirculating signal $V_{DCC}$ at the output of the flip-flop that forms the third delay element $D_3$; similarly, there is an early version of the recirculating signal $V_{DCC}$ at the output of the flip-flop that forms the first delay element $D_1$.

In even greater detail, the recirculating signal $V_{DCC}$ defines a pulse, which is delimited by a leading edge and by a trailing edge and has a duration equal to $N_{OR}*T_{CLK}$, where $T_{CLR}$ indicates the period of the locked signal $V_{LO}$, while $N_{OR}$ indicates the number of logical gates $O_1$-$O_5$. Thus, without any loss of generality, in the embodiment shown in FIG. 1, the recirculating signal $V_{DCC}$ is equal to '1' during a time window lasting $5*T_{CLK}$, otherwise it is equal to '0'.

In addition, the recirculating signal $V_{DCC}$ has a period that depends on the length of the shift register 19, i.e. by the number of memory cells, as described in greater detail further on.

Instead, with regard to the gating logical gate 18, this generates a signal $V_{gpls}$ (shown in FIG. 3), which represents a gated version of the $V_{pls}$ signal, where the gating action is exerted by the recirculating signal $V_{DCC}$.

Based on the described connections, the $V_{pls}$ signal, $V_{gpls}$ signal, recirculating signal $V_{DCC}$ and locked signal $V_{LO}$, which shall hereinafter be referred to altogether as the input signals, are present at the inputs of the decision stage 20.

As described in greater detail further on, the decision stage 20 controls the first, second and third control circuits 22, 24 and 26 based on the temporal position of the edges of the $V_{pls}$ signal with respect to the recirculating signal $V_{DCC}$.

Figure 2:
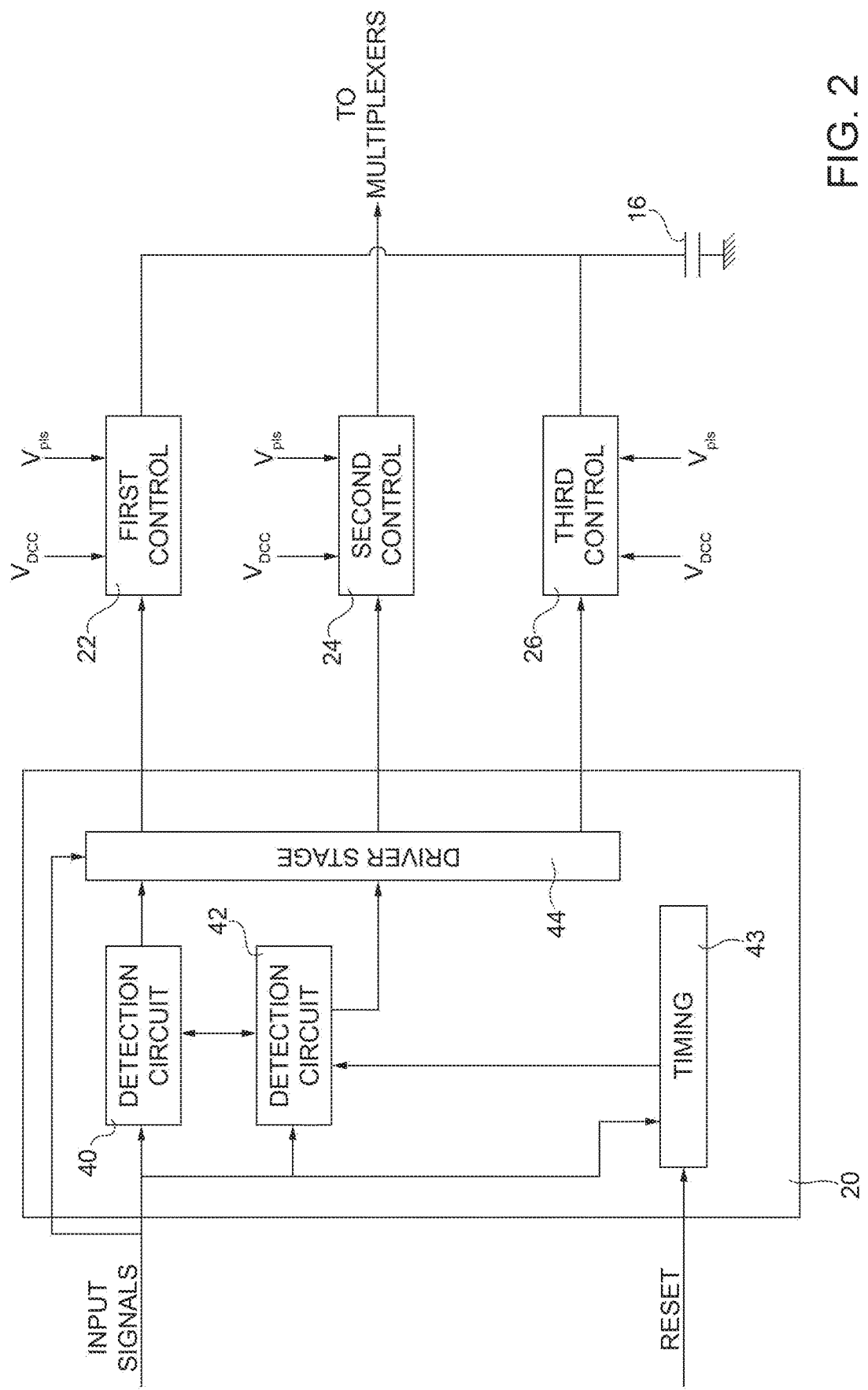
FIG. 2 shows a block diagram of a portion of the phase-locked loop shown in FIG. 1.

As shown in FIG. 2, the decision stage 20 comprises a first and a second detection circuit 40 and 42, which receive the aforesaid input signals. The decision stage 20 also comprises a timing circuit 43, which, in addition to the input signals, also receives the RESET signal as input (detail only visible in FIG. 2). The decision stage 20 also comprises a driver stage 44.

Although not shown, the RESET signal is also supplied to the first and to the second detection circuits 40 and 42 and to the driver stage 44, as well as to the first, second and third control circuits 22, 24 and 26.

The first detection circuit 40 has an input, adapted to receive the input signals, and also has a first output, which is connected to the driver stage 44, and a second output, which is connected to a first input of the second detection circuit 42; this last connection is of the two-way type.

The second detection circuit 42 also has a second input, which is adapted to receive the input signals, and an output, which is connected to the driver stage 44.

The timing circuit 43 generates a fine timing signal, on the basis of the recirculating signal $V_{DCC}$, the locked signal $V_{LO}$ and the RESET signal. The fine timing signal is supplied on a third input of the second detection circuit 42 and is indicative, for each pulse of the recirculating signal $V_{DCC}$, of five temporal subintervals in which the same pulse is divided, as shown for example, in FIGS. 4B-4E. In particular, each of the five temporal subintervals has a duration equal to a period $T_{CLK}$ of the locked signal $V_{LO}$.

Still with reference to the recirculating signal $V_{DCC}$, it can be observed that its period and the duration of its pulses are not constant, as they depend on the voltage $V_{CTRL}$, which, in use, is subject to more or less marked adjustments, as described further on. Therefore, in this description, unless specified otherwise, reference is made to a period of the recirculating signal $V_{DCC}$ to indicate the time elapsing between a leading (or trailing) edge of the recirculating signal $V_{DCC}$ and the next leading (or trailing) edge. In other words, reference is made to a period of the recirculating signal $V_{DCC}$ to indicate, more correctly, a cycle of an edge of the recirculating signal $V_{DCC}$ inside the shift register 19. Furthermore, considering each pulse of the recirculating signal $V_{DCC}$, the corresponding five temporal subintervals have temporal durations that can differ, albeit by a small amount, from each other, due to simultaneous variations in the voltage $V_{CTRL}$. For the purposes of this description, these possible differences in duration are not considered, as they are irrelevant for the purposes of implementation of the present phase-locked loop. In relation to this, the five temporal subintervals of each pulse of the recirculating signal $V_{DCC}$ are determined by the timing circuit 43 on the basis of five corresponding consecutive pulses of the locked signal $V_{LO}$, and therefore frequency changes of the locked signal $V_{LO}$ do not entail any loss of consistency in the phase-locked loop 1.

Referring to the driver stage 44 again, this has three outputs, which form the outputs of the decision stage 20 and are respectively connected to the first inputs of the first, second and third control circuits 22, 24 and 26. Furthermore, the driver stage 44 receives the aforesaid input signals.

Figure 4A:
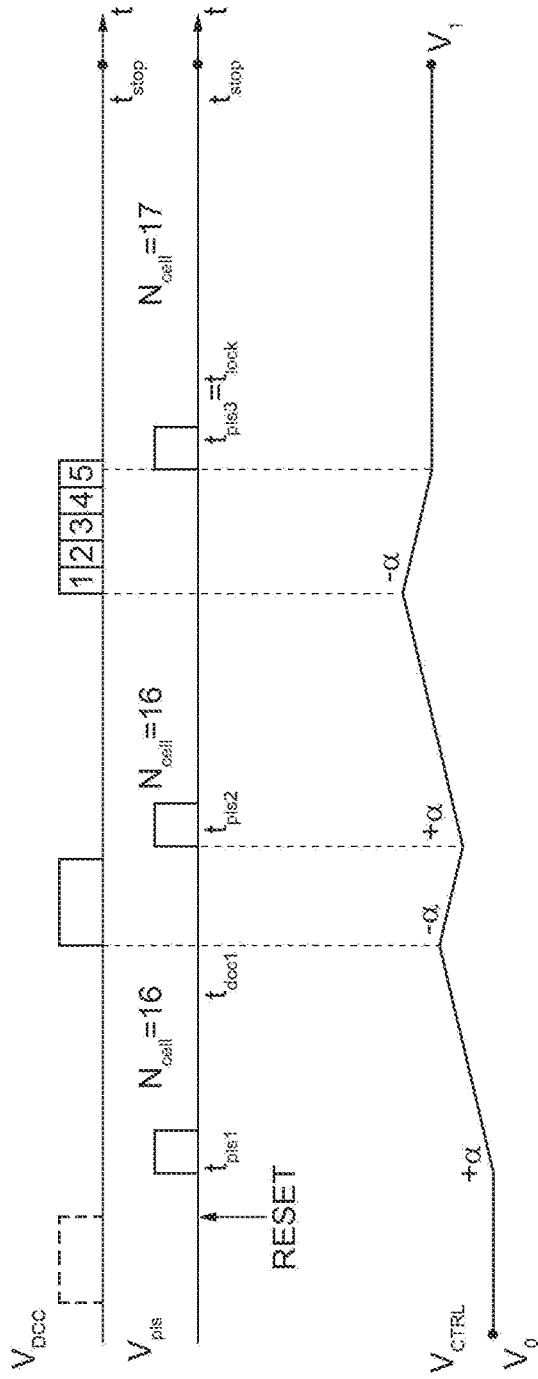
FIGS. 4A and 5A show temporal plots of signals generated in the phase-locked loop shown in FIG. 1.

Operation of the decision stage 20 will now be described in greater depth. To this end, it is assumed, for simplicity of description, that when the oscillator 14 is started, it generates the locked signal $V_{LO}$ with an initial frequency $f_0$ slightly lower (for example, 20% less) than the frequency that the locked signal $V_{LO}$ will have following the locking of the phase-locked loop 1. It is also assumed that, as shown in FIG. 4A, the decision stage 20 starts to operate following reception of the leading edge of the first pulse of the $V_{pls}$ signal after starting.

In detail, on the basis of the input signals, the first detection circuit 40 determines, for each leading edge of the $V_{pls}$ signal, whether that leading edge (temporally) falls within a corresponding pulse of the recirculating signal $V_{DCC}$. Furthermore, the first detection circuit 40 supplies the driver stage 44 with a first sensing signal, which precisely indicates whether any given leading edge of the $V_{pls}$ signal falls within a corresponding pulse of the recirculating signal $V_{DCC}$ or falls outside the pulses of the recirculating signal $V_{DCC}$.

As long as the first detection circuit 40 determines that the leading edges of the $V_{pls}$ signal fall outside the pulses of the recirculating signal $V_{DCC}$, i.e. as long as the leading edges of the $V_{pls}$ signal do not temporally overlap the pulses of the recirculating signal $V_{DCC}$, the decision stage 20 operates in a first operating mode, which shall hereinafter be referred to as the unlock mode.

In particular, when the decision stage 20 operates in the unlock mode, the driver stage 44 keeps the third control circuit 26 disabled, and therefore decoupled from the capacitor 16. Furthermore, the driver stage 44 controls the second control circuit 24 such that the latter controls the first and the second multiplexers 10 and 12 in such a way that the shift register 19 is constituted by sixteen delay elements $D_1$-$D_{16}$.

In other words, when the decision stage 20 operates in the unlock mode, the sixteenth delay element $D_{16}$ is connected to the first and to the fifteenth delay element $D_1$ and $D_{15}$, unlike the seventeenth and eighteenth delay elements $D_{17}$ and $D_{18}$, which are decoupled from the other delay elements. In consequence, the period of the recirculating signal $V_{DCC}$ is equal to $16*T_{CLK}$.

In addition, when the decision stage 20 operates in the unlock mode, the driver stage 44 keeps the first control circuit 22 enabled, which controls the voltage $V_{CTRL}$ present on the capacitor 16 as described below.

In detail, considering the time interval running between two consecutive leading edges of the $V_{pls}$ signal, it can be assumed that only one leading edge of the $V_{DCC}$ signal falls between these two consecutive leading edges of the $V_{pls}$ signal, as it has been assumed that when the oscillator 14 is started, it generates the locked signal $V_{LO}$ with an initial frequency $f_0$ slightly lower than the frequency that the locked signal $V_{LO}$ will have following the locking of the phase-locked loop 1. That having been said, in the aforesaid time interval, the first control circuit 22 varies the voltage $V_{CTRL}$ based on the temporal position of the aforesaid leading edge of the $V_{DCC}$ signal with respect to the aforesaid two consecutive leading edges of the $V_{pls}$ signal. In consequence, in the aforesaid time interval, an overall decrease/increase in the frequency of the locked signal $V_{LO}$ occurs, based on the temporal relation between the two consecutive leading edges of the $V_{pls}$ signal and the leading edge of the recirculating signal $V_{DCC}$ falling between them, which shall hereinafter also be referred to as the intervening leading edge of the recirculating signal $V_{DCC}$. In turn, the frequency variation of the locked signal $V_{LO}$ entails a corresponding variation in the frequency of the recirculating signal $V_{DCC}$.

In greater detail, the first control circuit 22 varies the voltage $V_{CTRL}$, as shown in FIG. 4A for example, where it is assumed that the leading edge of the first pulse of the $V_{pls}$ signal after starting occurs at time $t_{pls1}$.

Until time $t_{pls1}$, the voltage $V_{CTRL}$ remains constant and equal, for example, to a value $V_O$.

Then, at time $t_{pls1}$, the first control circuit 22 linearly increases the voltage $V_{CTRL}$, with a coefficient equal to a value $\alpha$, until the moment when the aforesaid intervening leading edge of the recirculating signal $V_{DCC}$ occurs, which shall hereinafter be referred to as time $t_{dcc1}$.

Then, at time $t_{dcc1}$, the first control circuit 22 linearly decreases the voltage $V_{CTRL}$, with a coefficient equal (in modulus) to the value $\alpha$, until the moment when the second of the aforesaid two consecutive leading edges of the $V_{pls}$ signal occurs, which shall hereinafter be referred to as time $t_{pls2}$.

In other words, between times $t_{pls1}$ and $t_{pls2}$, the frequency of the locked signal $V_{LO}$ is varied as a function of the time shift between the recirculating signal $V_{DCC}$ and the $V_{pls}$ signal.

Since time $t_{pls2}$ does not fall within any pulse of the recirculating signal $V_{DCC}$, and in particular does not fall within the pulse of the recirculating signal $V_{DCC}$ delimited by the aforesaid intervening leading edge, the decision stage 20 continues to operate in unlock mode. Therefore, the driver stage 44 controls the first, second and third control circuits 22, 24 and 26 as previously described with reference to the time interval $[t_{pls1}-t_{pls2}]$.

Still referring to the unlock mode, for each pair of consecutive leading edges of the $V_{pls}$ signal, following the arrival of the corresponding intervening leading edge of the recirculating signal $V_{DCC}$, the first control circuit 22 switches between a first condition, in which it increases the voltage $V_{CTRL}$, and a second condition, in which it lowers the voltage $V_{CTRL}$.

In practice, the first control circuit 22 operates in such a way as to accelerate the occurrence of a time instant in which the leading edge of the $V_{pls}$ signal falls within a corresponding pulse of the recirculating signal $V_{DCC}$, in fact, this event would occur in any case, on account of the initial frequency difference between the recirculating signal $V_{DCC}$ and the $V_{pls}$ signal, but would happen more slowly.

As previously mentioned, the decision stage 20 operates in unlock mode until a leading edge of a pulse of the $V_{pls}$ signal falls within a corresponding pulse of the recirculating signal $V_{DCC}$, this event being detected by the first detection circuit 40 and thus being represented by the first sensing signal.

In general, hereinafter reference is made to the condition where the leading edge of the $V_{pls}$ signal falls within a corresponding pulse of the recirculating signal $V_{DCC}$ as being in the lock condition. Furthermore, hereinafter reference is made to the first lock time $t_{lock}$ to indicate the first moment, after starting, wherein a leading edge of the $V_{pls}$ signal falls within a corresponding pulse of the recirculating signal $V_{DCC}$.

Purely by way of example, in FIG. 4A the first lock time $t_{lock}$ coincides with time $t_{pls3}$, wherein the leading edge of the third pulse of the $V_{pls}$ signal occurs, which falls within the second pulse of the recirculating signal $V_{DCC}$ after starting.

After detection of the lock condition by the first detection circuit 40, the driver stage 44 controls the first control circuit 22 so as to keep voltage $V_{CTRL}$ constant. In FIG. 4A, after the first lock time $t_{lock}$, the voltage $V_{CTRL}$ remains equal to a value $V_1$.

In addition, after detection of the lock condition by the first detection circuit 40, the second detection circuit 42 performs the operations described below.

In detail, the second detection circuit 42 determines, on the basis of the fine timing signal supplied by the timing circuit 43, in which, the five temporal subintervals of the pulse of the recirculating signal $V_{DCC}$ the leading edge of the $V_{pls}$ signal falls.

If the leading edge of the $V_{pls}$ signal falls within a temporal subinterval of the corresponding $V_{DCC}$ pulse other than the third temporal subinterval, the lock is coarse, otherwise the lock is fine.

The information on the temporal subinterval in which the leading edge of the $V_{pls}$ signal falls, and therefore on the type of locking, is supplied to the driver stage 44 by the second detection circuit 42, through the generation of a second sensing signal on its output. For each lock generically detected by the first detection circuit 40, the driver stage 44 is therefore able to discriminate between whether that lock is coarse (as in the case shown in FIG. 4A) or fine (as in the case shown in FIG. 5A).

After detecting a coarse lock, the driver stage 44 performs the following operations if the leading edge of the $V_{pls}$ signal falls within the fourth or fifth temporal subinterval of the corresponding $V_{DCC}$ pulse; this event occurs for example, in FIG. 4A, where time $t_{pls3}$ falls within the fifth temporal subinterval of the corresponding pulse of the recirculating signal $V_{DCC}$.

In detail, the driver stage 44 controls the second control circuit 24 such that the latter controls the first and the second multiplexers 10 and 12 in such a way that the shift register 19 is constituted by fifteen delay elements $D_1$-$D_n$ and by the seventeenth and by the eighteenth delay element $D_{17}$-$D_{18}$, i.e. it is constituted by seventeen elements.

In other words, the second control circuit 24 controls the first and the second multiplexers 10 and 12 so as to increment the number of delay elements that form the shift register 19 by one, with respect to a situation where the shift register 19 is formed by sixteen delay elements. In facts, the fact that the leading edge of the $V_{pls}$ signal falls within the fourth or fifth temporal subinterval of the corresponding pulse of the recirculating signal $V_{DCC}$ implies that the shift register 19 is too short with respect to a desired condition where the leading edge of the $V_{pls}$ signal falls within the third temporal subinterval of the corresponding pulse of the recirculating signal $V_{DCC}$. Therefore, the shift register 19 must be extended, so as to delay the recirculating signal $V_{DCC}$.

The increase in the number of memory cells that form the shift register 19 takes place in a manner such that the length of the aforesaid bit subsequence equal to '1' remains unaltered. More generally, and with reference also to that described further on, the second control circuit 24 controls the first and the second multiplexers 10 and 12 in a way such that variations in length of the shift register 19 take place without altering the length of the aforesaid bit subsequence equal to '1', as well as in a way to introduce, in the event of increasing the number of memory cells, a corresponding number of bits equal to '0'. In other words, the number of consecutive bits of the aforesaid bit subsequence equal to '1' remains unchanged with respect to the number of memory cells of the shift register 19.

For example, the second control circuit 24 switches the first and the second multiplexers 10 and 12 before the first bit of the bit subsequence equal to '1' arrives at the input of the first multiplexer 10, or after the last bit of the bit subsequence equal to '1' has left the second multiplexer 12.

After detecting a coarse lock, if the leading edge of the $V_{pls}$ signal falls within the first or second temporal subinterval of the corresponding $V_{DCC}$ pulse, the driver stage 44 performs the following operations instead.

In detail, the driver stage 44 controls the second control circuit 24 such that the latter controls the first and the second multiplexers 10 and 12 in such a way that the shift register 19 is constituted by fifteen delay elements $D_1$-$D_{15}$.

In other words, the second control circuit 24 controls the first and the second multiplexers 10 and 12 so as to reduce the number of delay elements that form the shift register 19 by one, with respect to the situation where the shift register is formed by sixteen delay elements. In facts, the fact that the leading edge of the $V_{pls}$ signal falls within the first or the second time interval of the corresponding pulse of the recirculating signal $V_{DCC}$ implies that the shift register 19 is too long with respect to the desired condition, in which the leading edge of the $V_{pls}$ signal falls within the third temporal subinterval of the corresponding pulse of the recirculating signal $V_{DCC}$. Therefore, the shift register 19 must be shortened, so as to anticipate the recirculating signal $V_{DCC}$.

In practice, after detecting a coarse lock, the decision stage 20 operates in an operating mode in which the second control circuit 24 varies the length of the shift register 19, with respect to the unlock operating mode. In this operating mode, which shall hereinafter be referred to as the acceleration mode, the decision stage 20 modifies the phase of the recirculating signal $V_{DCC}$ so as to accelerate convergence towards the aforesaid desired condition, in which the leading edges of the $V_{pls}$ signal fall inside the third temporal subintervals of the corresponding pulses of the recirculating signal $V_{DCC}$ (fine lock).

In addition to that described above, after detecting a coarse lock, the decision stage 20 also changes the frequency of the recirculating signal $V_{DCC}$, as described below.

In detail, referring to the leading edge of the $V_{pls}$ signal following the first lock time $t_{lock}$ as the new leading edge, the driver stage 44 discriminates, on the basis of the first and the second sensing signals, between the following four scenarios, which are described with reference to FIGS. 4B-4E, in which the new leading edge occurs at time $t_{pls4}$.

In greater detail, if the new leading edge of the $V_{pls}$ signal falls in fourth or fifth temporal subinterval of the corresponding pulse of the recirculating signal $V_{DCC}$ (case shown in FIG. 4B), the driver stage 44 keeps the length of the shift register 19 equal to seventeen. In relation to this, in FIGS. 4A-4E, the number of memory cells of the shift register 19 is indicated by $N_{cell}$.

In addition, the driver stage 44 disables the first control circuit 22 and enables the third control circuit 26, which (algebraically) adds a kind of predetermined contribution to value $V_1$. In particular, the third control circuit 26 linearly decreases the voltage $V_{CTRL}$ starting from the moment when the third temporal subinterval of the corresponding pulse of the recirculating signal $V_{DCC}$ begins, until the moment when this third temporal subinterval ends; the reduction takes place linearly, with a coefficient equal (in modulus) to a value $\beta < \alpha$ (the figures are not to scale).

In this way, a reduction in the frequency of the locked signal $V_{LO}$ is achieved, and therefore an increase in the period of the recirculating signal $V_{DCC}$ (as indicated by the dashed arrow in FIG. 4B), which results in a tendency towards the fine lock condition, in which the leading edge of the $V_{pls}$ signal falls within the third temporal subinterval of the corresponding pulse of the recirculating signal $V_{DCC}$.

Instead, if the new leading edge of the $V_{pls}$ signal falls in the first or in the second temporal subinterval of the corresponding pulse of the recirculating signal $V_{DCC}$ (case shown in FIG. 4C), the driver stage 44 controls the second control circuit 24 so that the length of the shift register 19 becomes equal to fifteen.

In addition, the driver stage 44 disables the first control circuit 22 and enables the third control circuit 26, which adds a kind of predetermined contribution to value $V_1$. In particular, the third control circuit 26 linearly increases the voltage $V_{CTRL}$ starting from the moment when the third temporal subinterval of the corresponding pulse of the recirculating signal $V_{DCC}$ begins, until the moment when this third temporal subinterval ends. The increase takes place linearly, with a coefficient equal to value $\beta$.

In this way, an increase in the frequency of the locked signal $V_{LO}$ occurs, and therefore a drop in the period of the recirculating signal $V_{DCC}$ (as indicated by the dashed arrow in FIG. 4C), which results in a tendency towards the fine lock condition.

Instead, if the new leading edge of the $V_{pls}$ signal falls in the third temporal subinterval of the corresponding pulse of the recirculating signal $V_{DCC}$ (case shown in FIG. 4D), this means that fine locking has occurred. In consequence, the decision stage 20 starts to operate in a further operating mode, which shall hereinafter be referred to as the steady-state operating mode.

In detail, the driver stage 44 controls the second control circuit 24 so that the length of the shift register 19 is equal to sixteen. Furthermore, the driver stage 44 disables the first control circuit 22 and enables the third control circuit 26, coupling it to the capacitor 16.

The third control circuit 26 (algebraically) adds a contribution to value $V_1$ of the voltage $V_{CTRL}$ that depends on the misalignment between the new leading edge of the $V_{pls}$ signal and the centre of the third temporal subinterval of the corresponding pulse of the recirculating signal $V_{DCC}$.

In particular, starting from the beginning of the aforesaid third temporal subinterval, the third control circuit 26 linearly decreases the voltage $V_{CTRL}$, until time $t_{pls4}$, when the new leading edge of the pulse of the $V_{pls}$ signal occurs. Then, at time $t_{pls4}$, the third control circuit 26 linearly increases the voltage $V_{CTRL}$, until the end of the aforesaid third temporal subinterval.

The decrease and the increase of voltage $V_{CTRL}$ caused by the third control circuit 26 occur with coefficients equal (in modulus) to $\beta$. Therefore, if the new leading edge of the $V_{pls}$ signal occurs at the same moment as the centre of the third temporal subinterval of the corresponding pulse of the recirculating signal $V_{DCC}$, the voltage $V_{CTRL}$ remains equal to value $V_1$. Vice versa, if (as shown in FIG. 4D) the new leading edge of the $V_{pls}$ signal occurs before the centre of the third temporal subinterval of the corresponding pulse of the recirculating signal $V_{DCC}$, the voltage $V_{CTRL}$ increases with respect to value $V_1$, so as to cause a small reduction in the period of the recirculating signal $V_{DCC}$. On the contrary, if the new leading edge of the pulse of the $V_{pls}$ signal occurs after the centre of the third temporal subinterval of the corresponding pulse of the recirculating signal $V_{DCC}$ (case not shown), the voltage $V_{CTRL}$ decreases with respect to the value $V_1$, so as to cause a small increase in the period of the recirculating signal $V_{DCC}$.

Instead, if the new leading edge of the $V_{pls}$ signal falls outside of the pulses of the recirculating signal $V_{DCC}$ (case shown in FIG. 4E), the decision stage 20 returns to operating in unlock mode. Therefore, the length of the shift register 19 returns to being equal to sixteen. Furthermore, after time $t_{pls4}$, the first control circuit 22 returns to linearly increasing the voltage $V_{CTRL}$, with a coefficient equal to a value $\alpha$, until the next leading edge (not shown) of the recirculating signal $V_{DCC}$, which will fall between the leading edge of the $V_{pls}$ signal occurring at time $t_{pls4}$ and the next leading edge of the $V_{pls}$ signal (not shown), which will occur, for example, at time $t_{pls5}$ (not shown).

Although not shown, the decision stage 20 is configured in such a way that the time plots of the signals shown in FIGS. 4B-4C would remain the same, even if the first lock time $t_{lock}$ (see FIG. 4A) had fallen in the first, second or fourth temporal subinterval of the corresponding pulse of the recirculating signal $V_{DCC}$ (in this case, the second pulse after starting).

Referring again to the scenarios shown in FIGS. 4B-4D, i.e. the scenarios that entail maintaining the coarse lock condition (FIGS. 4B-4C) or reaching a fine lock condition (FIG. 4D), for each leading edge of the $V_{pls}$ signal following the aforesaid new leading edge (the latter occurring at time $t_{pls4}$), the driver stage 44 iterates the previously described operations, both with regard to controlling voltage $V_{CTRL}$, and with regard to controlling the length of the shift register 19. In particular, the driver stage 44 checks if i) the leading edge of the $V_{pls}$ signal falls within the fourth or fifth temporal subinterval of the corresponding pulse of the recirculating signal $V_{DCC}$, or if ii) the leading edge of the $V_{pls}$ signal falls within the first or the second temporal subinterval of the corresponding pulse of the recirculating signal $V_{DCC}$; or if iii) the leading edge of the $V_{pls}$ signal falls within the third temporal subinterval of the corresponding pulse of the recirculating signal $V_{DCC}$; or if iv) the leading edge of the $V_{pls}$ signal falls outside of the corresponding pulse of the recirculating signal $V_{DCC}$. After determining the scenarios i), ii), iii) and iv), the driver stage 44 performs the operations described with reference to FIGS. 4B, 4C, 4D and 4E, respectively.

Referring again to the scenarios shown in FIGS. 4B-4D, for practical purposes, the implementation of the variations in voltage $V_{CTRL}$ shown in these figures can take place as described hereinafter.

In detail, the driver stage 44 detects whether the aforesaid new leading edge of the $V_{pls}$ signal, which occurs at time $t_{pls4}$, falls within the time window formed by the first and second temporal subintervals of the corresponding pulse of the recirculating signal $V_{DCC}$, in which case the driver stage 44 then varies the voltage $V_{CTRL}$ in the third temporal subinterval, as shown in FIG. 4C.

On the contrary, if the aforesaid new leading edge of the $V_{pls}$ signal does not arrive during the time window formed by the first and second temporal subintervals of the corresponding pulse of the recirculating signal $V_{DCC}$, the driver stage 44 detects, for the entire duration of the third temporal subinterval, whether the new leading edge of the $V_{pls}$ signal appears, and also linearly decreases the voltage $V_{CTRL}$, with a coefficient equal (in modulus) to until the first of the following two events occurs: the end of the third temporal subinterval; or the arrival of the new leading edge of the $V_{pls}$ signal.

In particular, if the third temporal subinterval ends before the arrival of the new leading edge of the $V_{pls}$ signal, the driver stage 44 keeps the voltage $V_{CTRL}$ constant at the end of the third temporal subinterval. The situation shown in FIG. 4B thus happens.

On the contrary, if the new leading edge of the $V_{pls}$ signal arrives before the end of the third temporal subinterval, the driver stage 44 decreases the voltage $V_{CTRL}$ with a coefficient equal (in modulus) to $\beta$ until the moment when the new leading edge of the $V_{pls}$ signal occurs and then linearly increases the voltage $V_{CTRL}$ with a coefficient equal until the end of the third temporal subinterval. The situation shown in FIG. 4D happens.

Figure 5A:
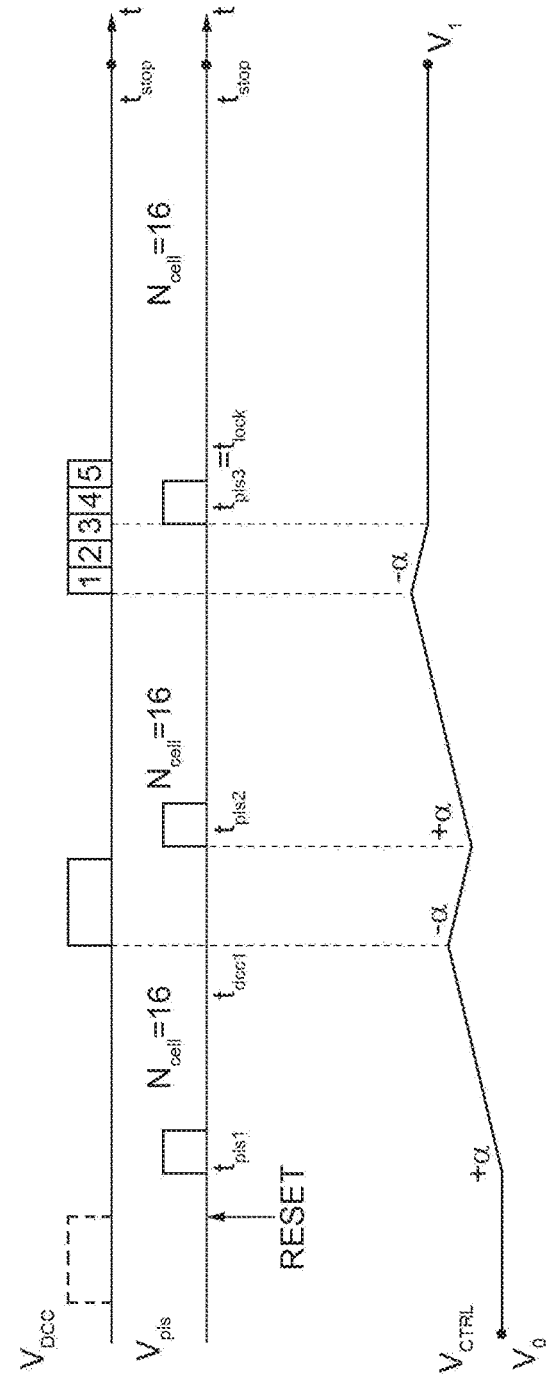

In the case where, as shown for example in FIG. 5A, the first lock time $t_{lock}$ (which, always by way of example, coincides with time $t_{pls3}$) falls within the third temporal subinterval of the corresponding pulse of the $V_{pls}$ signal, i.e. in the case of direct passage from unlock mode to the steady-state operating mode, the decision stage 20 operates as shown in FIGS. 5A-5E.

In detail, after detecting the fine lock condition, performed on the basis of the first and the second sensing signals, the driver stage 44 controls the first control circuit 22 so as to keep the voltage $V_{CTRL}$ constant after the first lock time $t_{lock}$. Furthermore, the driver stage 44 controls the second control circuit 24 in such a way that the length of the shift register remains equal to sixteen, i.e. it does not vary with respect to the unlock mode.

In addition to that described above, after detecting a first fine lock, the decision stage 20 performs the same operations described with reference to FIGS. 4B-4E.

In detail, referring to the new leading edge to indicate the leading edge of the $V_{pls}$ signal following the first lock time $t_{lock}$, the driver stage 44 discriminates, on the basis of the first and the second sensing signals, between the following four scenarios, which are described with reference to FIGS. 5B-5E and in which the new leading edge occurs at time $t_{pls4}$.

In greater detail, if the new leading edge of the $V_{pls}$ signal falls in the fourth or fifth temporal subinterval of the corresponding pulse of the recirculating signal $V_{DCC}$ (case shown in FIG. 5B), this means that a passage from fine lock to coarse lock has taken place. In consequence, the driver stage 44 modifies the length of the shift register 19, so that it becomes equal to seventeen, and controls the third control circuit 26 so that it operates as described with reference to FIG. 4B.

Instead, if the new leading edge of the $V_{pls}$ signal falls in the first or the second temporal subinterval of the corresponding pulse of the recirculating signal $V_{DCC}$ (case shown in FIG. 5C), this means that a passage from fine lock to coarse lock has again taken place. In consequence, the driver stage 44 controls the second control circuit 24 so that the length of the shift register 19 becomes equal to fifteen. In addition, the driver stage 44 controls the third control circuit 26 so that it operates as described with reference to FIG. 4C.

Instead, if the new leading edge of the $V_{pls}$ signal falls in the third temporal subinterval of the corresponding pulse of the recirculating signal $V_{DCC}$ (case shown in FIG. 5D), this means that the fine lock has been maintained. In consequence, the driver stage 44 controls the second control circuit 24 so that the length of the shift register 19 remains equal to sixteen. In addition, the driver stage 44 controls the third control circuit 26 so that it operates as described with reference to FIG. 4D.

Instead, if the new leading edge of the $V_{pls}$ signal falls outside of the pulses of the recirculating signal $V_{DCC}$ (case shown in FIG. 5E), this means that locking has been lost and therefore the decision stage 20 returns to operating in unlock mode. In consequence, the driver stage 44 controls the second control circuit 24 so that the length of the shift register 19 remains equal to sixteen. In addition, the driver stage 44 disables the third control circuit 26 and enables the first control circuit 22, so that it operates as described with reference to FIG. 4E.

In practice, referring to FIGS. 4A-4E and FIGS. 5A-5E, it may be noted how, in the absence of locking, the shift register 19 is formed by sixteen memory cells. Moreover, whenever a first lock (coarse or fine) occurs, i.e. a passage from an unlock condition to a lock condition (coarse or fine), the driver stage 44 determines the type of lock and controls the second control circuit 24 in such a way that the length of the shift register 19 is set equal to: sixteen, in the case of a fine lock; seventeen, in the case where the leading edge of the $V_{pls}$ signal falls in the fourth or fifth temporal subinterval of the corresponding pulse of the recirculating signal $V_{DCC}$; or fifteen, in the case where the leading edge of the $V_{pls}$ signal falls in the first or second temporal subinterval of the corresponding pulse of the recirculating signal $V_{DCC}$.

In addition, whenever a first lock (coarse or fine) occurs, the driver stage 44 makes the voltage $V_{CTRL}$ constant. Then, for each successive leading edge of the $V_{pls}$ signal that does not entail exiting the lock state, the driver stage 44 performs the operations described with reference, for example, to FIGS. 4B-4D; these operations are independent of the first lock type (fine, or coarse with an edge that falls in the fourth or fifth temporal subinterval of the corresponding pulse of the recirculating signal $V_{DCC}$, or still coarse with an edge that falls in the first or the second temporal subinterval of the corresponding pulse of the recirculating signal $V_{DCC}$), but depend only on the temporal relation existing between the current leading edge of the $V_{pls}$ signal and the corresponding pulse of the $V_{DCC}$ signal in which that edge falls. Instead, when a leading edge of the $V_{pls}$ signal is detected that entails exiting the lock state, the decision stage 20 returns to operating in unlock mode, as described with reference to FIGS. 4A and 5A, until a new first lock occurs, i.e. a leading edge of the $V_{pls}$ signal that falls within a corresponding pulse of the recirculating signal $V_{DCC}$.

In practice, whenever a leading edge of the $V_{pls}$ signal occurs, the decision stage 20 checks whether it is necessary to alter the length, on the basis of the relation existing between this leading edge and the corresponding pulse of the recirculating signal $V_{DCC}$. Furthermore, in the event of passage from an unlock condition to a lock condition (coarse or fine), the decision stage 20 makes the voltage $V_{CTRL}$ constant. The decision stage 20 will subsequently vary the voltage $V_{CTRL}$ on the successive leading edges of the $V_{pls}$ signal in cases where the lock is maintained, but will return to operating in unlock mode as soon as locking is lost.

According to a possible variant, the decision stage 20 operates on the basis of the $V_{gpls}$ signal, instead of on the basis of the $V_{pls}$ signal. In relation to this, it may be noted that the temporal relations between i) a leading edge of the $V_{pls}$ signal and the corresponding pulse of the recirculating signal $V_{DCC}$, and ii) the corresponding leading edge of the $V_{gpls}$ signal and the corresponding pulse of the recirculating signal $V_{DCC}$, are identical in cases where the leading edge of the $V_{pls}$ signal falls in any of the five subintervals of the corresponding pulse of the recirculating signal $V_{DCC}$. In consequence, what has been said regarding FIGS. 4B-4D and 5B-5D remains valid.

Figure 5C:
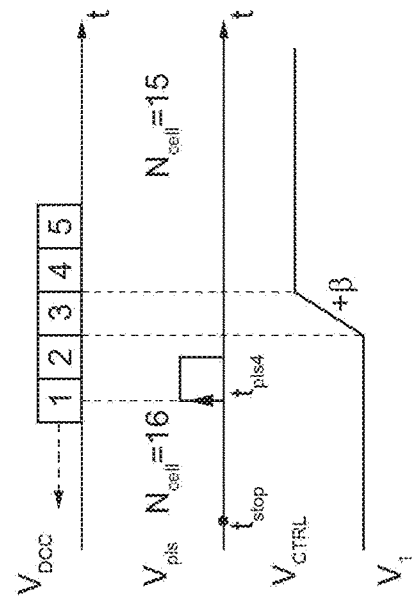
FIGS. 5B-5E show, on an enlarged scale, examples of possible developments over time of the signals shown in FIG. 5A.
Figure 5E:
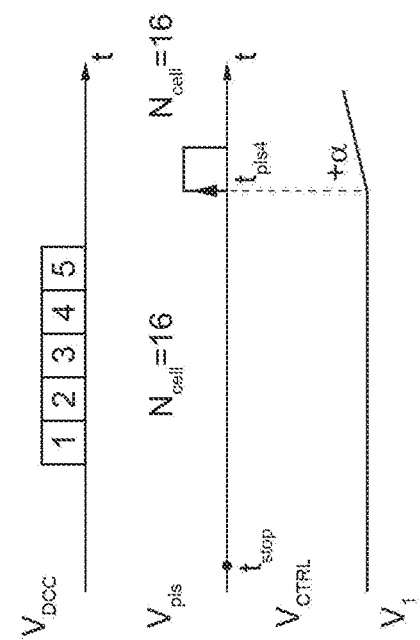
Figure 5B:
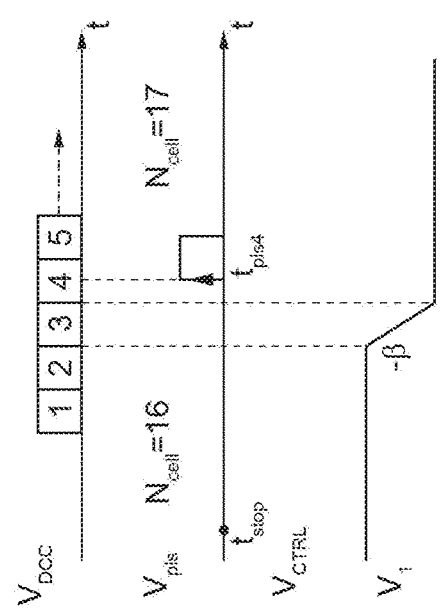
Figure 5D:
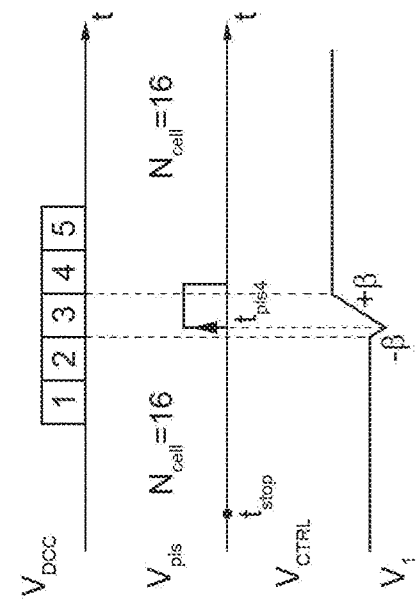
Figure 6:
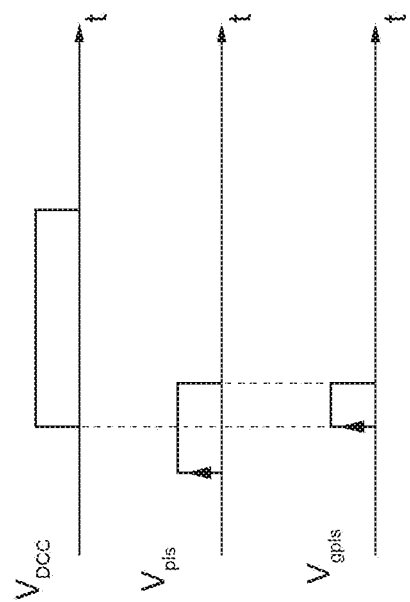
FIG. 6 shows examples of temporal plots of signals generated in the phase-locked loop shown in FIG. 1.

Conversely, the operation of this variant of the phase-locked loop 1 differs with respect to that previously described in the case where the leading edge of the $V_{pls}$ signal falls in advance with respect to the corresponding pulse of the recirculating signal $V_{DCC}$, but the trailing edge of the $V_{pls}$ signal falls within the corresponding pulse of the recirculating signal $V_{DCC}$, as shown for example in FIG. 6. As has been described above, the decision stage 20 should operate in unlock mode, since, in any case, the leading edge of the $V_{pls}$ signal falls outside the corresponding pulse of the recirculating signal $V_{DCC}$. Instead, according to this variant of the phase-locked loop 1, the decision stage 20 operates as if the leading edge of the $V_{pls}$ signal falls in the first, or indifferently in the second, temporal subinterval of the corresponding pulse of the recirculating signal $V_{DCC}$. In other words, the decision stage 20 operates as previously described, with the only difference that the scenario shown in FIG. 6 is considered like a coarse lock, with a trailing edge of the $V_{pls}$ signal that falls within the first or the second temporal subinterval of the corresponding pulse of the recirculating signal $V_{DCC}$. Therefore, the driver stage 44 sets the length of the shift register 19 equal to fifteen and, in the case of lock following a previous first lock, modifies the voltage $V_{CTRL}$ as shown in FIGS. 4C and 5C.

Thanks to this variant, it is possible to further accelerate lock convergence, even in the case where the leading edge of the $V_{pls}$ signal falls outside of the corresponding pulse of the recirculating signal $V_{DCC}$. In fact, following locking (coarse or fine), if it is found that the next leading edge of the $V_{pls}$ signal anticipates the corresponding pulse of the recirculating signal $V_{DCC}$ by a limited amount of time, the decision stage 20 does not return to operating in unlock mode, but continues to increase the voltage $V_{CTRL}$ and sets the length of the shift register equal to fifteen.

Figure 7:
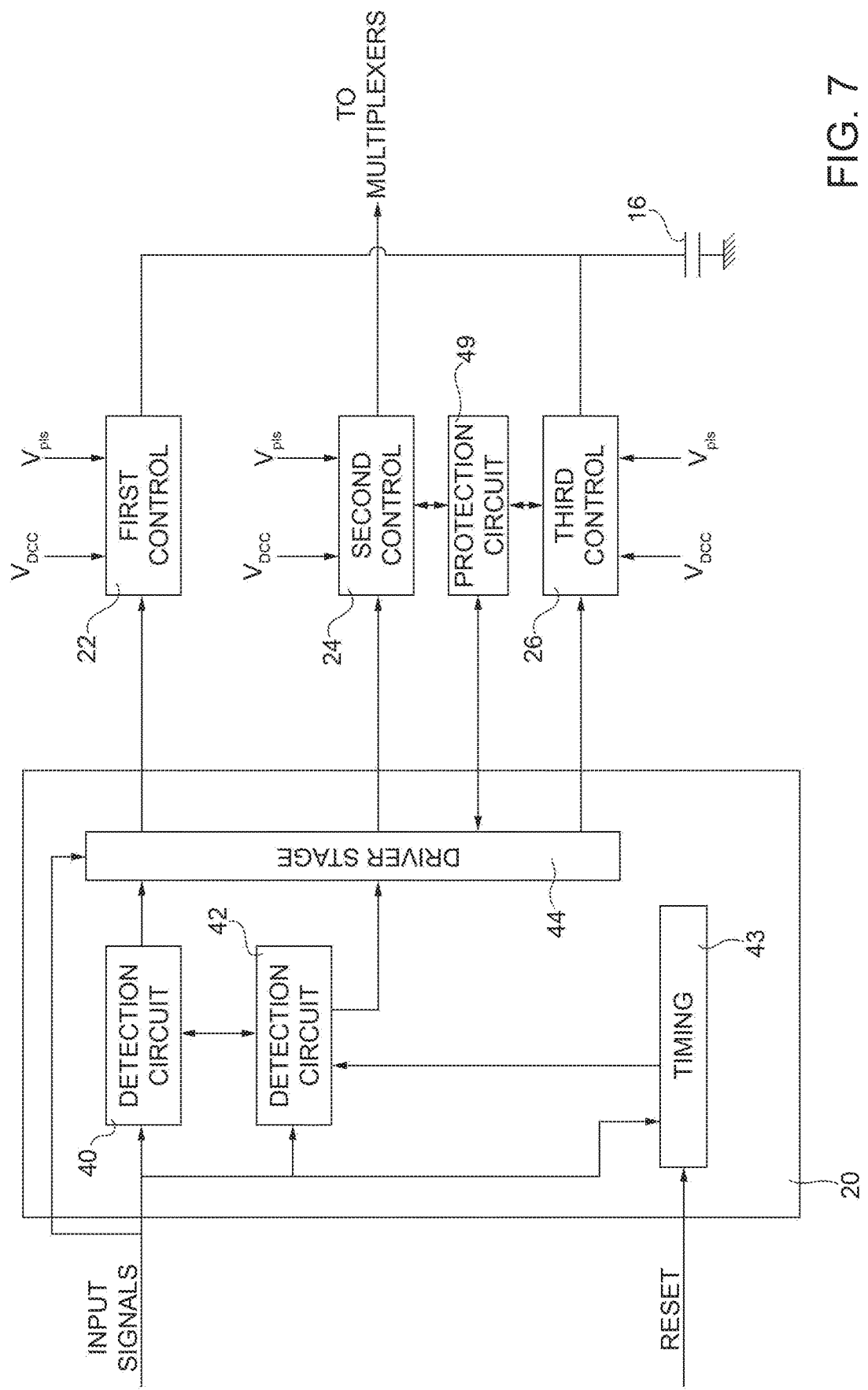
FIG. 7 shows a block diagram of a portion of a variant of the phase-locked loop shown in FIG. 1.

Independently of the difference between the aforesaid variant of the phase-locked loop 1 and that previously described, the applicant has observed that once the fine lock condition is reached, it is preferable to avoid the decision stage 20 returning to the acceleration mode. To this end, as shown in FIG. 7, it is possible for the phase-locked loop 1 to comprise a protection circuit 49, which is operatively coupled to the second and to the third control circuits 24 and 26 and to the driver stage 44. The protection circuit 49 is configured to detect if the decision stage 20 operates in the steady-state operating mode, and therefore if the leading edges of the $V_{pls}$ signal fall inside the third temporal sub-intervals of the corresponding pulses of the recirculating signal $V_{DCC}$ for a time interval greater than a time threshold, which is, for example, equal to the time employed by the recirculating signal $V_{DCC}$, and more properly by the sequence of bits stored in the shift register 19, to perform four cycles in the shift register 19. In other words, the protection circuit 49 is configured to detect whether the leading edges of a pulse train, which comprises a number of consecutive pulses of the $V_{pls}$ signal at least equal to a threshold (for example, equal to four), fall inside the third temporal subintervals of the corresponding pulses of the recirculating signal $V_{DCC}$.

Furthermore, if the leading edges of the $V_{pls}$ signal fall inside the third temporal subintervals of the corresponding pulses of the recirculating signal $V_{DCC}$ for a time interval greater than the time threshold, the protection circuit 49 controls the second control circuit 24 such that the latter controls the first and the second multiplexers 10 and 12 in such a way that the shift register 19 is constituted by sixteen delay elements $D_1$-$D_{16}$, independently of the operation of the first and the second detection circuits 42, i.e. independently of the fact that the successive leading edges of the $V_{pls}$ signal fall outside of the third temporal subintervals of the corresponding pulses of the recirculating signal $V_{DCC}$ (as long as the coarse lock is not lost). In this way, possible oscillation by the decision stage 20 between the steady-state operating mode and the acceleration mode is avoided, i.e. the possible occurrence of multiple locks is avoided.

Figure 8:
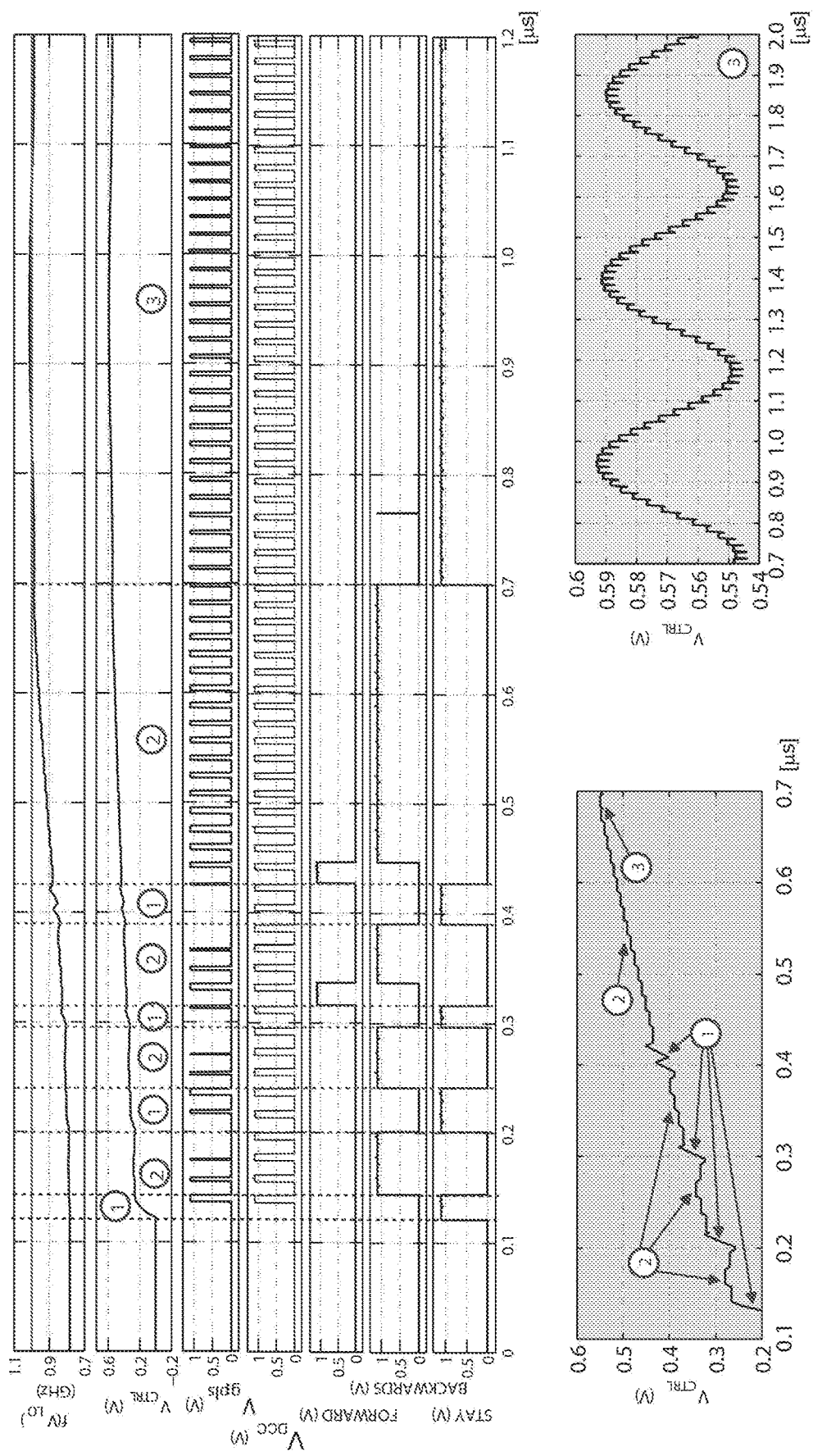
FIG. 8 shows the time plots of signals generated in the phase-locked loop shown in FIG. 1, as well as two enlarged portions of one of these signals.

Examples of the time plots of the voltage $V_{CTRL}$, the frequency $f(V_{LO})$ of the locked signal $V_{LO}$, the $V_{gpls}$ signal and the recirculating signal $V_{DCC}$ are shown in FIG. 8. In addition, FIG. 8 shows the time plots of three signals, respectively indicated by STAY, BACKWARDS and FORWARD, which are generated inside the second control circuit 24, and are logic signals that take the value '1' when the shift register 19 is constituted by sixteen, seventeen and fifteen delay elements, respectively. In addition, in FIG. 8, the operating modes of the decision stage 20 are still indicated by the symbols '1', '2', and '3', set inside circles.

FIG. 8 also shows an enlarged view of a portion of the voltage $V_{CTRL}$, which reveals how, after starting, the decision stage 20 operates in unlock mode, with a consequent appreciable increase in the voltage $V_{CTRL}$; then, the decision stage 20 operates in acceleration mode for two periods of the recirculating signal $V_{DCC}$, and the voltage $V_{CTRL}$ undergoes a small increase beforehand and a small decrease afterwards. Nevertheless, the phase change of the recirculating signal $V_{DCC}$ obtained in the acceleration phase is not sufficient to achieve locking, and so the decision stage 20 returns to operating in unlock mode, with a consequent new and appreciable increase in the voltage $V_{CTRL}$. Then, the acceleration and unlock phases alternate, until a time (close to 0.7 ρs), when the decision stage 20 starts to operate in the steady-state operating mode.

In practice, the phase-locked loop 1 processes both edges of the input signal $V_{OSC}$ (thus having a mean reaction time approximately equal to $2*f_{REF}$) and enables the generation of a reference signal (in particular, the locked signal $V_{LO}$), which can be used, for example, in an IR-UWB transmitter and has a first frequency $f_1=2*16*f_{REF}$.

Figure 9:
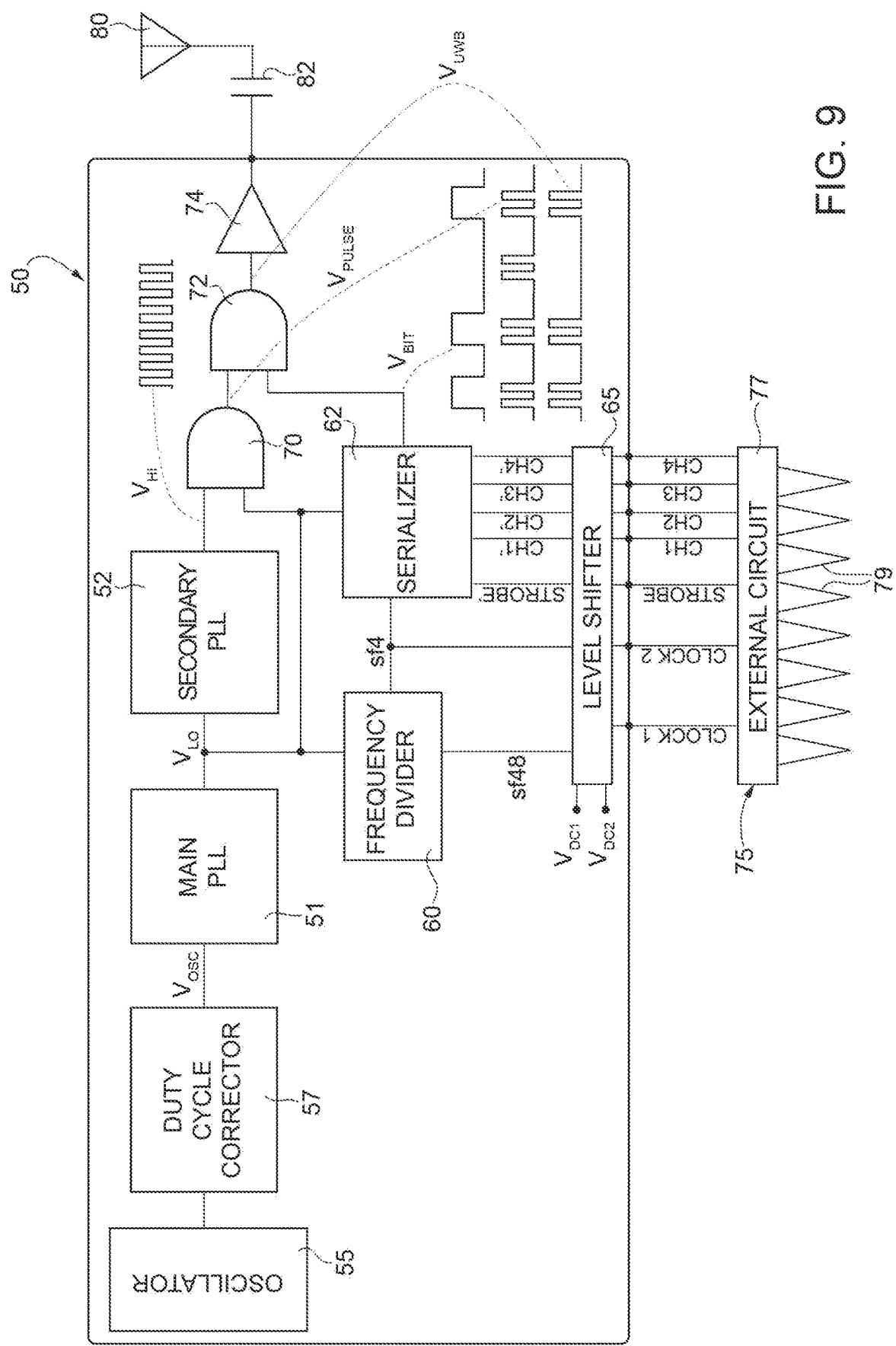
FIG. 9 shows a block diagram of an IR-UWB transmitter comprising the present phase-locked loop.

For example, FIG. 9 shows an IR-UWB transmitter 50 that comprises a main phase-locked loop 51 and a secondary phase-locked loop 51.

In addition, the transmitter 50 comprises an oscillator 55, which is formed, for example, by a Pierce oscillator, and a duty cycle corrector 57 (of a known type and optional).

The output of the oscillator 55 is connected to the input of the duty cycle corrector 57, the output of which is connected to the input of the main phase-locked loop 51. In a manner in itself known, the oscillator 55 and the duty cycle corrector supply the main phase-locked loop 51 with the aforesaid input signal $V_{OSC}$, which, as previously mentioned, is formed, for example, by a square wave with a 50% duty cycle and a frequency $f_{REF}$ equal, for example, to 31.25 MHz.

The main phase-locked loop 51 is the same as the previously described phase-locked loop 1 and is therefore configured to generate the locked signal $V_w$, which has the aforesaid first frequency $f_1=1$ GHz on its output. Furthermore, the output of the main phase-locked loop 51 is connected to the input of the secondary phase-locked loop 52, which is of a type in itself known and is configured to generate a signal $V_{H1}$ on its output, this signal having, for example, a second frequency $f_2=4*f_1=4$ GHz and being in phase with the locked signal $V_{LO}$, i.e. it has a fixed phase shift with respect to the latter; for simplicity of description, hereinafter it is assumed that this fixed phase shift is null, or in any case negligible. At any rate, this phase shift can be compensated by sizing the paths followed by the $V_{H1}$ signal and locked signal $V_{LO}$ accordingly.

The transmitter 50 also comprises a frequency divider 60 and a serializer 62, both of types in themselves known. For example, the frequency divider 60 is formed by bank of asynchronous dividers and is therefore asynchronous with respect to the signal on its input.

In detail, the frequency divider 60 has one input, which is connected to the output of the main phase-locked loop 51. In use, the frequency divider 60 generates a first and a second timing signal sf4 and sf48 on the basis of the locked signal $V_{LO}$, these timing signals being synchronous with one another and, for example, having respective frequencies of $f_2/4=250$ MHz and $f_2/48=20.833$ MHz. In particular, the first and the second timing signals sf4 and sf48 are respectively made available on a first and on a second output of the frequency divider 60.

The transmitter 50 also comprises a level-shifter stage 65 and a first and a second logical AND gate 70 and 72, which shall hereinafter be referred to as the first and the second transmission gate 70 and 72, respectively. The transmitter 50 also comprises an output stage 74, formed, for example, by a corresponding buffer.

In detail, the level-shifter stage 65 receives as input the first and the second timing signals sf4 and sf48, as well as a first and a second supply voltage $V_{DC1}$ and $V_{DC2}$, which are, for example, equal to 1.2V and 1.8V, respectively. The first supply voltage $V_{DC1}$ is used to power the transmitter 50, and therefore the oscillator 55, duty cycle corrector 57, the main phase-locked loop 51, the secondary phase-locked loop 52, the frequency divider 60, the serializer 62 the, first and the second transmission gates 70 and 72 and the output stage 74, the signals of which are thus generated in the domain of the first supply voltage $V_{DC1}$.

Without any loss of generality, the level-shifter stage 65 is further configured to be electrically coupled to an external electronic device 75.

In particular, the external electronic device 75 can comprise a plurality of electrodes 79 and an external electronic circuit 77, electrically connected to the electrodes 79. In a manner in itself known, the external electronic circuit 77 can acquire electrical signals via the electrodes 79, these signals being indicative of the corresponding data. For example, the electrodes 79 could acquire electrical signals originating from the human body.

In practice, the level shifter 65 acts as an interface that enables transferring data acquired from the external electronic circuit 77 to the transmitter 50. In relation to this, the level shifter 65 supplies the external electronic circuit 77 with a first and a second clock signal CLOCK1 and CLOCK2, which represent the versions of the first and second timing signals sf4 and sf48 in the domain of the second supply voltage $V_{DC2}$. In addition, the level shifter 65 is electrically connected to the external electronic circuit 77 through a plurality of channels. In particular, in the embodiment shown in FIG. 9, the level shifter 65 and the external electronic circuit 77 are connected by five channels, through which the external electronic circuit 77 transmits the signals respectively indicated as STROBE and CH1-CH4, which are in the domain of the second supply voltage $V_{DC2}$, to the level shifter 65.

Without any loss of generality, the external electronic circuit 77 implements a transmission protocol by means of the STROBE and CH1-CH4 signals that allows sending the acquired data to the level shifter 65 through the electrodes 79 of the external electronic circuit 77. In turn, the level shifter 65 is connected to the serializer 62 by five corresponding channels, through which the level shifter 65 transmits the signals indicated by STROBE' and CH1'-CH4', which respectively represent the versions of the STROBE and CH1-CH4 signals in the domain of the first supply voltage $V_{DC1}$, to the serializer 62.

In greater detail, the data acquired by the external electronic circuit 77 can be stored in a memory (not shown) of the external electronic circuit 77 and transmitted, together with the addresses related to the portions of memory in which the data is stored, via the CH1-CH4 signals.

Figure 10:
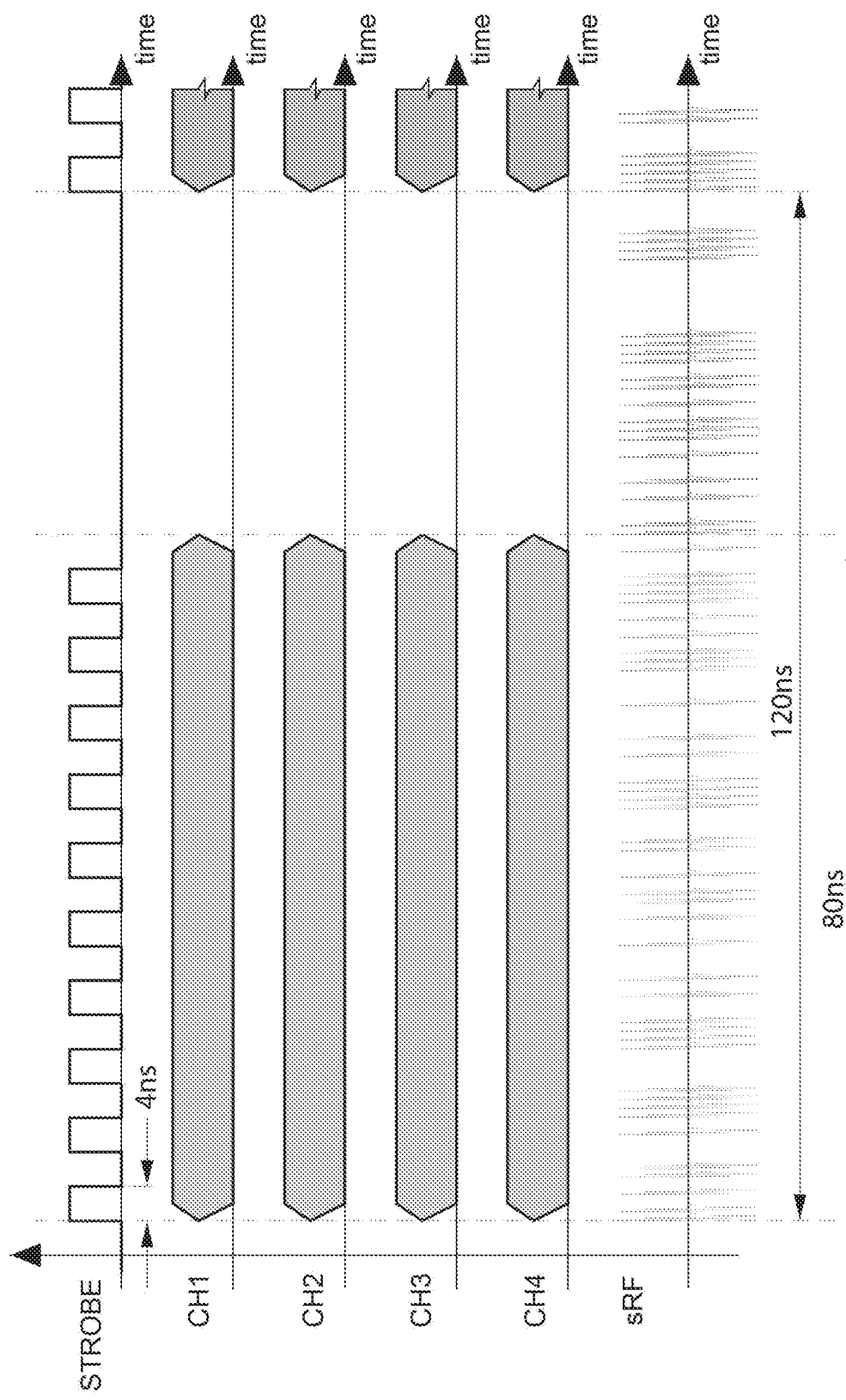
FIG. 10 shows the time plots of signals generated in the IR-UWB transmitter shown in FIG. 9.

In even greater detail, as shown in FIG. 10, the external electronic circuit 77 operates for successive periods, which shall hereinafter be referred to as periods of operation.

Each period of operation lasts 120 ns and comprises a transmission window, lasting 80 ns, and a successive silent window, lasting 40 ns.

During each transmission window, the external electronic circuit 77 generates the STROBE signal as a function of the first timing signal sf4, so that it is periodic, with a frequency of 125 MHz for example, and has a 50% duty cycle. Furthermore, during the transmission window, on each edge (whether leading or trailing) of the STROBE signal, the external electronic circuit 77 generates a corresponding bit for each for each of the four CH1-CH4 signals. Therefore, during each transmission window, each of the CH1-CH4 signals transports related 20-bit information, which, for example, is divided into a 10-bit address and 10 data bits.

Again, with reference to the serializer 62, this also has further inputs, connected respectively to the output of the main phase-locked loop 51, so as to receive the lock signal $V_{LO}$, as well as to the first output of the frequency divider 60, so as to receive the first timing signal sf4.

During each period of operation of the external electronic circuit 77, the serializer 62 acquires, via the STROBE' and CH1'-CH4' signals, the bits transmitted by the external electronic circuit 77 through the CH1-CH4 signals. Furthermore, the serializer 62 transmits the bits acquired during each period of operation with a latency of 120 ns.

In particular, given a first period of operation, the serializer 62 transmits the bits acquired during the first period of operation, transmission taking place for the entire duration (120 ns) of a successive second period of operation. Furthermore, during the second period of operation, the serializer 62 acquires new bits, which will then be transmitted in a successive third period of operation.

In greater detail, in order to transmit the bits acquired during each period of operation, the serializer 62 generates a signal $V_{BIT}$, with on-off keying (OOK) and a bit rate of 1 Gbit/s. Furthermore, for each period of operation, the corresponding $V_{BIT}$ signal is indicative of four corresponding data packets, each of which has a time duration of 30 ns and therefore contains thirty bits, which comprise, in addition to the twenty bits related to the data and the corresponding addresses, five control bits (for example, preamble bits) and five bits that form a parity check code. Purely by way of example, FIG. 9 qualitatively shows portions of the $V_{BIT}$ signal and the $V_{HI}$ signal.

The inputs of the first transmission gate 70 are respectively connected to the outputs of the main phase-locked loop 51 and of the secondary phase-locked loop 52, so as to receive the locked signal $V_{LO}$ and the $V_{HI}$ signal. The first transmission gate 70 thus performs a kind of gating operation on the $V_{HI}$ signal (at high frequency), on the basis of the locked signal $V_{LO}$ (at relatively low frequency); in this way, the first transmission gate 70 generates a signal $V_{PULSE}$ on its output, a portion of which is qualitatively shown in FIG. 9. In practice, the $V_{PULSE}$ signal is a kind of burst signal, i.e. it is formed by a succession of pulse bursts, each formed by two pulses. From another standpoint, each burst is formed by two cycles of the $V_{HI}$ signal.

The inputs of the second transmission gate 72 are respectively connected the outputs of the first transmission gate 70 and of the serializer 62, so as to respectively receive the $V_{PULSE}$ signal and $V_{BIT}$ signal. The second transmission gate 72 thus performs a kind of gating operation on the $V_{PULSE}$ signal, and in particular on the bursts of the $V_{PULSE}$ signal, on the basis of the $V_{BIT}$ signal, generating a signal $V_{UWB}$ on its output, a portion of which is qualitatively shown in FIG. 9. The $V_{PULSE}$ signal is synchronous with the $V_{BIT}$ signal.

The output of the second transmission gate 72 is connected to the output stage 74, the output of which can be connected to an antenna 80, for example, by inserting a decoupling capacitor 82, in order to allow transmission of the $V_{UWB}$ signal. In this case, a radio frequency signal is input to the antenna 80; an example of this signal is shown in FIG. 10, where it is indicated by sRF.

In practice, the locked signal $V_{LO}$, generated by the main phase-locked loop 51, is used both for managing the interface with the external electronic circuit 77, and for generating the high-frequency components of the IR-UWB pulses, i.e. the pulses of the aforesaid bursts (in other words, the two wave cycles of the carrier, present in each IR-UWB pulse).

The advantages that can be obtained with the present phase-locked loop emerge from the foregoing description. In particular, the so-called acceleration mode enables speeding up phase locking, and consequently enables reducing the consumption of the phase-locked loop. In addition, the steady-state operating mode enables achieving precise locking.

Finally, it is clear that modifications and variants can be made to the present phase-locked loop without departing from the scope of the present invention, as defined in the appended claims.

For example, the number and arrangement of the logical OR gates $O_1$-$O_5$ inside the delay chain 4 could vary with respect to that described. In particular, changing the number of these logical OR gates leads to a change in the duty cycle of the recirculating signal $V_{DCC}$.

Similarly, each pulse of the recirculating signal $V_{DCC}$ could be divided into a number of temporal subintervals other than five, but preferably odd.

Regarding the variations in voltage $V_{CTRL}$, shown for example in FIGS. 4A-4E and 5A-5E, these can generally have different profiles (whether with regard, for example, to linear coefficients, or with regard to the time domains in which the actual changes in voltage $V_{CTRL}$ occur, or even with regard to the linearity of the plots shown, which is optional), as well as time shifts with respect to the pulses of the $V_{DCC}$ signal and the $V_{pls}$ signal different from those described. For example, referring to FIGS. 4B-4C and 5B-5C, the voltage $V_{CTRL}$ could be altered not just inside the third temporal subinterval of the pulse of the recirculating signal $V_{DCC}$, but, for example, for the entire duration of the interval formed by second, third and fourth temporal subintervals.

The decision stage and the first, second and third control circuits could be implemented differently from that described.

Still referring to the timing with which the various operations are performed, the foregoing description has made reference, for example, to the leading edges of the $V_{pls}$ signal; nevertheless, embodiments are possible in which, for example, the operating modes of the decision stage depend on the positions of the trailing edges of the $V_{pls}$ signal, with respect to the corresponding pulses of the recirculating signal $V_{DCC}$.

It is also possible that the phase-locked loop be sized in such a way that the fine lock condition occurs when the edge of the $V_{pls}$ signal falls in a temporal subinterval of the corresponding pulse of the recirculating signal $V_{DCC}$ other than the third temporal subinterval. In this case, it is possible that the plots of the voltage $V_{CTRL}$ are different from that described; for example, it is possible that the plots in the case of coarse locking with an edge that falls before or after the third temporal subinterval are no longer symmetrical. Similarly, the lock could refer to a (predetermined) point of the third (or a different) temporal subinterval other than the centre, in which case the drop or increase of the voltage $V_{CTRL}$ take place with mutually different coefficients.

Regarding the aforesaid acceleration phase, this could entail variations in the length of the shift register higher, in modulus, than unity and/or different in modulus, in cases of phase advance and delay of the recirculating signal $V_{DCC}$.

Finally, the frequency of the $V_{HI}$ signal could be equal to a non-integer multiple of the frequency of the locked signal $V_{LO}$.

The invention claimed is:

1. A phase-locked loop circuit comprising:
a local oscillator, configured to generate a timing signal having a respective frequency;
a shift register of a circular type, which comprises a variable number of memory cells and is configured to store a sequence of bits that recirculates with a timing that depends upon the timing signal, said sequence of bits comprising a sub-sequence formed by a number of consecutive bits equal to one and the same logic value; and
a feedback control circuit configured to receive an input signal that defines a periodic succession of pulses, each of which is delimited by a respective edge of a first type, said feedback control circuit being coupled to the shift register so as to also receive a local signal indicating the shift of said sub-sequence of bits in the shift register and defining a plurality of pulses, each of which has a duration that depends upon said number of consecutive bits and upon the frequency of the timing signal;
and wherein the feedback control circuit comprises:
a first detection circuit configured to detect, for each pulse of the input signal, whether said pulse of the input signal respects a condition of temporal proximity with a corresponding pulse of the local signal;
a second detection circuit configured to detect, for each pulse of the input signal that respects the condition of temporal proximity with the corresponding pulse of the local signal, whether the edge of said pulse of the input signal falls early, late, or within a predefined portion of the corresponding pulse of the local signal;
a first control sub-circuit configured to control the local oscillator; and
a second control sub-circuit configured to control said number of memory cells;
and wherein the first control sub-circuit is configured to vary, for each pulse of the input signal that does not respect the condition of temporal proximity with any pulse of the local signal, the frequency of the timing signal, as a function of the time shift between the local signal and the input signal;
and wherein the second control sub-circuit is configured in such a way that, following upon each pulse of the input signal that does not respect the condition of temporal proximity with any pulse of the local signal, said number of memory cells is equal to a first number;
and wherein the second control sub-circuit is moreover configured in such a way that, following upon each pulse of the input signal that respects the condition of temporal proximity with the corresponding pulse of the local signal, said number of memory cells is equal to a second number, to a third number, or to a fourth number, if the edge of said pulse of the input signal falls respectively early, late, or within the predefined portion of the corresponding pulse of the local signal, the fourth number being comprised between the second and the third numbers, the second number being less than the fourth number;
and wherein the first control sub-circuit is moreover configured so as to increase the frequency of the timing signal by a first amount, and reduce the frequency of the timing signal by a second amount, for each pulse of the input signal that follows a preceding pulse of the input signal that respects the condition of temporal proximity with the corresponding pulse of the local signal, that respects the condition of temporal proximity with the corresponding pulse of the local signal, and that has an edge of the first type that is respectively early or late with respect to the predefined portion of the corresponding pulse of the local signal.

2. The circuit according to claim 1, wherein the first control sub-circuit is moreover configured to vary the frequency of the timing signal by a third amount, for each pulse of the input signal the edge of which of the first type falls within the predefined portion of the corresponding pulse of the local signal and follows a preceding pulse of the input signal that respects the condition of temporal proximity with the corresponding pulse of the local signal; and wherein said third amount is a function of the location of said edge of the first type with respect to a point of said predefined portion.

3. The circuit according to claim 2, wherein said third amount is a function of the distance of said edge from the point of said predefined portion of said corresponding pulse of the local signal; and wherein the first control sub-circuit increases the frequency of the timing signal if said edge falls within said predefined portion of said corresponding pulse of the local signal and is early with respect to the point of said predefined portion, or else reduces the frequency of the timing signal if said respective edge falls within said predefined portion of said corresponding pulse of the local signal and is late with respect to the point of said predefined portion.

4. The circuit according to claim 1, further comprising a timing circuit configured to determine, for each pulse of the local signal, a corresponding number of temporal subintervals that form said pulse and have a duration that depends upon the timing signal; and wherein said predefined portion of the corresponding pulse of the local signal is formed by a central temporal subinterval of said corresponding pulse of the local signal.

5. The circuit according to claim 1, wherein said first control sub-circuit is configured to vary, for each pulse of the input signal that does not respect the condition of temporal proximity with any pulse of the local signal, the frequency of the timing signal as a function of the temporal distance between the respective edge of said pulse of the input signal and a subsequent pulse of the local signal falling between said respective edge of said pulse of the input signal and the subsequent edge of the first type of the input signal, and as a function of the temporal distance between said subsequent pulse of the local signal and said subsequent edge of the first type of the input signal.

6. The circuit according to claim 1, wherein said condition of temporal proximity is satisfied if the edge of the first type of the pulse of the input signal falls within the corresponding pulse of the local signal.

7. The circuit according to claim 1, wherein said condition of temporal proximity is satisfied if the edge of the first type of the pulse of the input signal falls within the corresponding pulse of the local signal or else if it is early with respect to said corresponding pulse of the local signal by a time not longer than a threshold time.

8. The circuit according to claim 1, further comprising:
a first protection circuit configured to detect whether the edges of the first type of a pulse train, which comprises a number at least equal to a threshold of consecutive pulses of the input signal that respect the condition of temporal proximity with the corresponding pulses of the local signal, fall within the predefined portions of said corresponding pulses of the local signal; and
a second protection circuit configured to control the second control sub-circuit in such a way that, if the edges of the first type of said pulse train fall within the predefined portions of the corresponding pulses of the local signal, said number of memory cells remains equal to said first number until a subsequent edge of the first type of a subsequent pulse of the input signal falls outside of the corresponding pulse of the local signal.

9. A transmitter comprising:
a first phase-locked loop circuit according to claim 1;
a second phase-locked loop circuit configured to receive said timing signal and to generate an intermediate signal, which has a frequency equal to a multiple of the frequency of the timing signal and is phase-locked with the timing signal;
a first gating circuit configured to modulate the intermediate signal as a function of the timing signal so as to generate a burst signal that defines a succession of bursts, each burst being formed by a plurality of corresponding cycles of the intermediate signal; and
a second gating circuit configured to receive a data signal and to modulate the burst signal as a function of the data signal.

10. The transmitter according to claim 9, wherein said data signal has a modulation of an ON-OFF type.

11. A system comprising:
a sensing device including a plurality of electrodes configured to receive signals representing data, in particular biomedical data, and an external electronic circuit configured to store bits representing said data and to transmit signals representing said stored bits; and
a transmitter according to claim 9;
and wherein the transmitter further comprises:
an interface circuit configured to couple to said external electronic circuit so as to receive the signals transmitted by said external electronic circuit; and
a generator coupled to said interface circuit and configured to generate said data signal as a function of said stored bits.

12. A method for phase locking a timing signal, having a respective frequency, to an input signal, which defines a periodic succession of pulses, each of which is delimited by a respective edge of a first type, said method comprising the steps of:

in a shift register of a circular type having a variable number of memory cells, recirculating a sequence of bits with a timing that depends upon the timing signal, said sequence of bits comprising a sub-sequence formed by a number of consecutive bits equal to one and the same logic value; and
generating a local signal representing the shift of said sub-sequence of bits and defining a plurality of pulses, each of which has a duration that depends upon said number of consecutive bits and upon the frequency of the timing signal;
said method further comprising the steps of:
detecting, for each pulse of the input signal, whether said pulse of the input signal respects a condition of temporal proximity with a corresponding pulse of the local signal; and
detecting, for each pulse of the input signal that respects the condition of temporal proximity with the corresponding pulse of the local signal, whether the edge of said pulse of the input signal falls early, late, or within a predefined portion of the corresponding pulse of the local signal;
said method further comprising the steps of:
varying, for each pulse of the input signal that does not respect the condition of temporal proximity with any pulse of the local signal, the frequency of the timing signal, as a function of the time shift present between the local signal and the input signal;
following upon each pulse of the input signal that does not respect the condition of temporal proximity with any pulse of the local signal, setting said number of memory cells equal to a first number;
following upon each pulse of the input signal that respects the condition of temporal proximity with the corresponding pulse of the local signal, setting said number of memory cells equal to a second number, to a third number, or to a fourth number, if the edge of said pulse of the input signal falls respectively early, late, or within the predefined portion of the corresponding pulse of the local signal, the fourth number being comprised between the second and third numbers, the second number being less than the fourth number; and
for each pulse of the input signal that follows a preceding pulse of the input signal that respects the condition of temporal proximity with the corresponding pulse of the local signal, that respects the condition of temporal proximity with the corresponding pulse of the local signal, and that has an edge of the first type that is early or late with respect to the predefined portion of the corresponding pulse of the local signal, respectively increasing the frequency of the timing signal by a first amount, or reducing the frequency of the timing signal by a second amount.

13. The method according to claim 12, further comprising the step of:
for each pulse of the input signal the edge of which of the first type falls within the predefined portion of the corresponding pulse of the local signal and follows a preceding pulse of the input signal that respects the condition of temporal proximity with the corresponding pulse of the local signal, varying the frequency of the timing signal by a third amount, which is a function of the location of said edge of the first type with respect to the point of said predefined portion.

14. The method according to claim 13, wherein said third amount is a function of the distance of said edge from the point of said predefined portion of said corresponding pulse of the local signal; said method further comprising the steps of increasing the frequency of the timing signal if said edge falls within said predefined portion of said corresponding pulse of the local signal and is early with respect to the point of said predefined portion, or else reducing the frequency of the timing signal if said respective edge falls within said predefined portion of said corresponding pulse of the local signal, and is late with respect to the point of said predefined portion.

15. The method according to claim 12, further comprising the step of determining, for each pulse of the local signal, a corresponding number of temporal subintervals that form said pulse and have a duration that depends upon the timing signal; and wherein said predefined portion of the corresponding pulse of the local signal is formed by a central temporal subinterval of said corresponding pulse of the local signal.

16. The method according to claim 12, further comprising the step of:
   for each pulse of the input signal that does not respect the condition of temporal proximity with any pulse of the local signal, varying the frequency of the timing signal as a function of the temporal distance between the respective edge of said pulse of the input signal and a subsequent pulse of the local signal falling between said respective edge of said pulse of the input signal and the subsequent edge of the first type of the input signal, and as a function of the temporal distance between said subsequent pulse of the local signal and said subsequent edge of the first type of the input signal.

17. The method according to claim 12, further comprising the steps of:
   detecting whether the edges of the first type of a pulse train, which comprises a number at least equal to a threshold of consecutive pulses of the input signal that respect the condition of temporal proximity with the corresponding pulses of the local signal, fall within the predefined portions of said corresponding pulses of the local signal; and
   if the edges of the first type of said pulse train fall within the predefined portions of the corresponding pulses of the local signal, setting said number of memory cells equal to said first number until a subsequent edge of the first type of a subsequent pulse of the input signal falls outside of the corresponding pulse of the local signal.

18. A method for transmitting data, comprising the steps of:
   executing the method for phase locking a timing signal according to claim 12;
   as a function of the timing signal, generating an intermediate signal, which has a frequency equal to a multiple of the frequency of the timing signal and is phase-locked with the timing signal;
   modulating the intermediate signal as a function of the timing signal so as to generate a burst signal that defines a succession of bursts, each burst being formed by a plurality of corresponding cycles of the intermediate signal; and
   receiving a data signal and modulating the burst signal as a function of the data signal.

* * * * *